US008373429B2

(12) United States Patent
Slupsky et al.

(10) Patent No.: US 8,373,429 B2
(45) Date of Patent: *Feb. 12, 2013

(54) METHOD AND APPARATUS FOR INTERROGATING AN ELECTRONIC COMPONENT

(76) Inventors: Steven Slupsky, Edmonton (CA); Christopher Sellathamby, Edmonton (CA)

(*) Notice: Subject to any disclaimer, the term of this patent is extended or adjusted under 35 U.S.C. 154(b) by 95 days.

This patent is subject to a terminal disclaimer.

(21) Appl. No.: 12/207,458

(22) Filed: Sep. 9, 2008

(65) Prior Publication Data

US 2009/0066356 A1    Mar. 12, 2009

Related U.S. Application Data

(63) Continuation-in-part of application No. 12/281,903, filed as application No. PCT/CA2007/000368 on Mar. 6, 2007.

(60) Provisional application No. 60/779,786, filed on Mar. 7, 2006, provisional application No. 60/681,558, filed on Nov. 28, 2006.

(51) Int. Cl.
*G01R 31/302* (2006.01)
(52) U.S. Cl. .................................. 324/754.31
(58) Field of Classification Search ........................ None
See application file for complete search history.

(56) References Cited

U.S. PATENT DOCUMENTS

| 690,378 | A | | 12/1901 | Stanfield |
| 5,070,297 | A | * | 12/1991 | Kwon et al. ................. 324/754 |
| 5,198,647 | A | * | 3/1993 | Mizuta ......................... 235/449 |
| 5,293,400 | A | | 3/1994 | Monod |
| 5,345,231 | A | | 9/1994 | Koo |
| 5,395,231 | A | | 3/1995 | Maejima |
| 5,764,655 | A | | 6/1998 | Kirihata |
| 5,952,849 | A | | 9/1999 | Haigh |
| 6,003,777 | A | | 12/1999 | Kowalski |
| 6,119,255 | A | * | 9/2000 | Akram ........................ 714/724 |
| 6,161,205 | A | | 12/2000 | Tuttle |
| 6,262,600 | B1 | | 7/2001 | Haigh |
| 6,331,782 | B1 | | 12/2001 | White |
| 6,412,086 | B1 | | 6/2002 | Friedman |
| 6,484,279 | B2 | | 11/2002 | Akram |
| 6,525,566 | B2 | | 2/2003 | Haigh |
| 6,625,682 | B1 | | 9/2003 | Simon |
| 6,732,301 | B1 | | 5/2004 | Landry |
| 6,759,863 | B2 | | 7/2004 | Moore |
| 6,759,864 | B2 | * | 7/2004 | Patel ........................ 324/762.02 |
| 6,836,866 | B2 | | 12/2004 | Nolles |

(Continued)

FOREIGN PATENT DOCUMENTS

| JP | 01-138478 A | 5/1989 |
| JP | 10-115668 A | 5/1998 |

(Continued)

OTHER PUBLICATIONS

Collins, P., et al., "A Transparent Solution for Providing Remote Wired or Wireless Communication to Board and System Level Boundary-Scan Architectures" International Test Conference 2005, Paper 2.2.

(Continued)

*Primary Examiner* — Paresh Patel
(74) *Attorney, Agent, or Firm* — Christensen O'Connor Johnson Kindness PLLC

(57) ABSTRACT

A method and apparatus for interrogating an electronic component, includes a body having an interface for an interrogating device to use as a conduit in reliably performing multiple discrete interrogations of the electronic component without the interrogating device physically touching the electronic component.

22 Claims, 42 Drawing Sheets

U.S. PATENT DOCUMENTS

| | | | |
|---|---|---|---|
| 6,873,065 | B2 | 3/2005 | Haigh |
| 6,885,202 | B2 | 4/2005 | Slupsky |
| 7,073,111 | B2 | 7/2006 | Whetsel |
| 7,075,329 | B2 | 7/2006 | Chen |
| 7,109,730 | B2 | 9/2006 | Slupsky |
| 7,176,487 | B2 * | 2/2007 | Sakamoto et al. ............. 257/48 |
| 7,183,788 | B2 * | 2/2007 | Moore .................... 324/754.31 |
| 7,202,687 | B2 * | 4/2007 | Khandros et al. ........ 324/754.03 |
| 7,253,571 | B2 * | 8/2007 | Kang et al. ..................... 315/312 |
| 7,466,157 | B2 * | 12/2008 | Miller ........................ 324/750.3 |
| 2001/0052645 | A1 * | 12/2001 | Op'T Eynde et al. ........ 257/700 |
| 2002/0186106 | A1 | 12/2002 | Miller |
| 2004/0004216 | A1 | 1/2004 | Eldridge |
| 2005/0086021 | A1 | 4/2005 | Khandros |
| 2005/0138499 | A1 * | 6/2005 | Pileggi et al. ................. 714/724 |
| 2005/0193294 | A1 | 9/2005 | Hildebrant |
| 2005/0223289 | A1 * | 10/2005 | Ho ................................ 714/30 |
| 2006/0232323 | A1 | 10/2006 | Mohr |
| 2006/0252375 | A1 | 11/2006 | Wu |

FOREIGN PATENT DOCUMENTS

| | | |
|---|---|---|
| JP | 2001-085622 A | 3/2001 |
| JP | 2007-520722 A | 7/2007 |
| WO | 2004/046741 A1 | 6/2004 |
| WO | 2005/076885 A2 | 8/2005 |
| WO | 2007/010480 A2 | 1/2007 |

OTHER PUBLICATIONS

Cauvet, P., "SiP Technology and Testing" Mar. 28, 2007.

De Jong, F., and A. Biewenga, "SiP-TAP: JTAG for SiP" International Test Conference 2006, Paper 14.3.

Floyd, B., et al., "Wireless Interconnection in CMOS IC with Integrated Antennas," IEEE ISSCC 2000, Paper WA 19.6, Feb. 2000, pp. 238-239.

Harvey, K., "Cost of Test Issues for RF SiP Circuits" KGD Conference, 2006.

IEEE Computer Society, "IEEE Standard Test Access Port and Boundary-Scan Architecture" IEEE Std. 1149.1-2001, New York: IEEE, 2001.

"International Technology Roadmap for Semiconductors" SIA 2005 Edition.

Kuroda, T., "Inductive-Coupling Inter-Chip Link for System in a Package" CMOS-Emerging Technologies Workshop Banff, AB, Canada, Jul. 19, 2006.

Mann, W., "Leading Edge of Wafer Level Testing" Proceedings of the ITC International Test Conference, 2004.

Mcelney, J., "Testing of Converging Device Technologies: High-Efficiency Multi-Site Test for SiP Mobile Technologies" KGD Conference, 2006.

Moore, B., et al., "Design of a Wireless On-wafer Sub-Micron Characterization System" IEEE TVLSI Journal vol. 2 Feb. 2005.

Park, N., et al., "Quality-effective repair of multichip module systems" (Abstract) Journal of Systems Architecture, 47, Apr. 2002, pp. 883-900.

Reis, I., et al., "On-line Boundary-Scan Testing in Service of Extended Products" (Abstract) International Test Conference 2006, Lecture 4.2.

Sellathamby, C., et al., "Non Contact Wafer Probe using Wireless Probe Cards" International Test Conference, IEEE, 2005, Paper 18.3.

Sellathamby, C., et al., "Wireless Wafer Probe" Southwest Test Workshop, Session 7, Jun. 9, 2004.

Sunter, S., and B. Nadeau-Dostie, "Complete, Contactless I/O Testing—Reaching the Boundary in Minimizing Digital IC Testing Cost", International Test Conference 2002, Paper 16.2.

Whetsel, L., "A High Speed Reduced Pin Count JTAG Interface" International Test Conference 2006, Paper 10.1.

Written Opinion mailed May 27, 2009, issued in International Application No. PCT/CA2009/000235, filed Feb. 26, 2009, 4 pages.

Eberle, H., "A Radio Network for Monitoring and Diagnosing Computer Systems," IEEE Computer Society 23(1):60-65, Jan./Feb. 2003.

Eberle, H., "Radioport: A Radio Network for Monitoring and Diagnosing Computer Systems," Proceedings of the 10th Symposium on High Performance Interconnects HOT Interconnects (Hotl '02), Stanford, California, Aug. 21-23, 2002, 5 pages.

Supplementary European Search Report mailed Sep. 21, 2011, issued in corresponding European Application No. EP 07 71 0702, filed Dec. 3, 2008, 5 pages.

Wang, Y., and M. Margala, "New Embedded Core Testing for System-On-Chips and System-In-Packages," Canadian Conference on Electrical and Computer Engineering (CCECE '06), Ottawa, May 2006, pp. 1897-1900.

Wu, C.-W., et al., "The HOY Tester—Can IC Testing Go Wireless?" International Symposium on VLSI Design, Automation and Test (VLSI-DAT), Hsinchu, Taiwan, Apr. 26-28, 2006, pp. 1-4.

Japanese Patent Office Notification of Reasons for Refusal, mailed Feb. 21, 2012, issued in corresponding Japanese Patent Application No. 2008-557565, filed Mar. 6, 2007, 14 pages.

\* cited by examiner

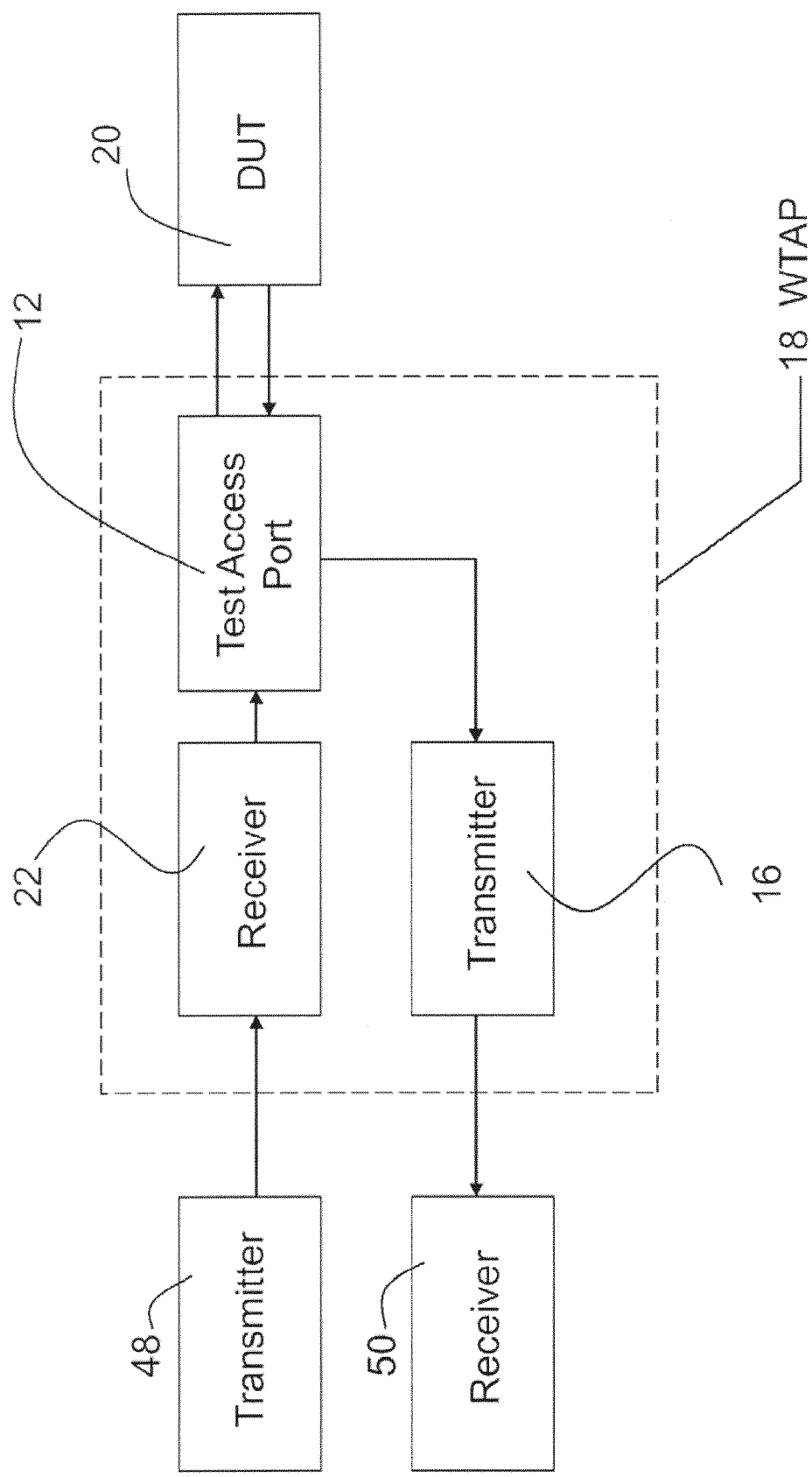

METHOD AND APPARATUS FOR INTERROGATING AN ELECTRONIC COMPONENT

BACKGROUND

The testing of electronic components is an integral part of the electronics industry. The predominant and only commonly-used method of communicating or testing (collectively referred to herein as interrogating) electronics is by making physical, electrical contact between a probe and the electronic component, also known as "DC coupling," or "wireline coupling."

One problem with this technique is the fact that it requires physical contact with the device being accessed. Consider the example of an integrated circuit. Integrated circuits have on-chip structures for connecting the semiconductor chip to the outside world. These structures are conductive, and usually metallic in nature. Common structures ("touchpads" or "bondpads") include pads and solder balls. Typically, test needles are brought into contact with the circuit at these touchpads in order to make a DC-coupled, wireline link by which to test the integrated circuit. Typical characteristics of the test needles include a spring force and a tip shape that induces a pressure at the point of contact.

Touchpads commonly used in modern integrated circuits to couple electronic signals are very fragile and subject to damage during mechanical probe. Damage of the touchpad can cause failure of the integrated circuit. Further, the mechanical stresses associated with mechanical contact to the structure often induces stresses into the integrated circuit beyond the conductive structure itself leading to additional failure modes of the integrated circuit. This creates other problems as well, since these structures are used later when the integrated circuit is packaged. The damage caused to the touchpads makes it difficult to connect the integrated circuit to a package or substrate, where it can interface with other electrical systems.

Another area where this physical damage causes problems is in System-in-Package ("SiP") integration. It is known that manufacturers prefer that no pad on a SiP be probed more than one time. Such a restriction makes it difficult to touch multiple times during the assembly process flow. Thus, the testing of assembled SiP devices and the components of SiP's is a serious obstacle to large scale adoption of the technology. SiP has seen widespread adoption in memory devices using the stacked approach but little acceptance in other areas. Wireless handsets are beginning to ramp SiP manufacturing but manufacturing yields are a major concern due to Known Good Die (KGD) test reliability. The testing of such heterogeneous SiP modules is a significant and growing problem in the electronics manufacturing industry, where current test technology only allows testing after complete assembly and packaging of the SiP. Rapid growth in the highly cost conscious consumer and communications (primarily cellular phone) applications has magnified this problem. SiPs are seen as an economic way to reduce the time-to-market by the use of small specific function ICs on miniature substrates rather than the time, cost and effort to build completely integrated ICs known as System-on-Chip (SoC). Rather than the vastly more expensive complete circuit integration of SoC solutions, SiP technology enables the best-of-class, best-cost, or best-mixed technologies in separate ICs to be assembled on one SiP substrate.

Typically, the package for an integrated circuit only contains one semiconductor chip. For reasons of size, cost and performance, it is often desirable to place multiple chips inside a single package. However, if multiple, untested circuits are placed within a single package, and a single chip is defective, it becomes extremely costly or it may not be viable to replace or fix the single faulty chip. Hence the entire package, including the working dice, is discarded. This leads to inflated costs.

Consequently, it is desirable to fully test integrated circuits before they are integrated within a single package. However, when there is damage caused by the physical contact experienced in conventional test methods, it becomes difficult to integrate these chips using a SiP approach. Further, Automatic Test Equipment (ATE) and wafer probe environments involve very costly equipment and impart a significant cost to test at the wafer level. Thus semiconductor manufacturers have a dilemma balancing test cost with device yield and therefore, a new technique must be developed that does not damage the substrate during testing.

Unfortunately, testing a SiP is not the same as testing an IC. SiP testing has the challenges similar to system or PCB level testing combined with the technical challenges of chip testing. An example of the latter is the fine placement of test probes required for SiP testing. The inherent flexibility of SiP level integration means that specific ICs included on a SiP are changeable with a smaller non-recurring engineering (NRE) investment than that of a monolithic solution. This means that SiP testing methods must be flexible as well. The design-for-test of single monolithic ICs is not available in SiPs as SiPs typically don't use fully custom ICs.

Like PCB testing IC testing has evolved to include boundary scan testing which is included on many chips and built to a standard, such as the JTAG standard for testing IEEE 1149.1. Boundary scan TAP techniques allow for the testing of ICs on PCBs without the need to individually probe IC pins. This technique overcomes two major economic and technical challenges of SiP manufacturing that is, testing coverage and throughput. This method is also economic in that it uses standard automatic test equipment (ATE) infrastructure and techniques. Extensions to standard boundary scan techniques are needed for multi-device testing on SiP packages.

It is beneficial to interrogate electronic components without causing damage to the devices. One method of avoiding this physically-induced damage is to avoid physical contact altogether using a method of interrogating electronic components in a wireless (rather than wireline) manner. A method to accomplish wireless testing has been described previously. Wireless, non-contact testing can potentially alleviate many of the above SiP testing constraints, allowing for significant improvements in both the economics of SiP manufacturing, and the ability to integrate more test functions with less I/O.

Important feedback during the production process can be gained in addition to the basic earlier tests. This feedback relays information regarding any global or local physical faults, and even circuit-level faults, providing the process engineer the ability to respond earlier, leading to improved yield and thus an improvement in the economics of SiP manufacturing. With mid-stream testing dies, substrates, passives, and VLSI parts can be tested as they are assembled.

The present method for wireless communication is that of inductive coupling. A current flowing through one inductor generates a magnetic field which extends beyond the inductor. This field induces current in another inductor within close proximity of the first inductor, coupling the two inductors together.

RF techniques are then used to transmit data between the inductors. For example, a digital signal can be modulated by a carrier wave, and then driven through an inductor. The receiving inductor picks up some fraction of this modulated wave, and passes the signal on to a receiver circuit. The use of RF techniques for transmitting data is the reason the inductors are sometimes called "antennae." Many microfabricated antenna designs have been, and continue to be, researched for various applications such as clocking and data transfer. These designs are generally intended for non-test applications and do not meet the cost, performance and data integrity requirements for applications such as SiP testing. The designs presented here create RF transceivers meeting the cost and performance goals of SiP applications. Specialized RF CMOS technologies and other technologies like SiGe are not used for the stated economic reasons, but the concepts may be implemented in these processes for technical reasons. Although many designs may be used for transmitting and receiving data wirelessly, many are not suitable in wafer testing applications since they require a large power budget, or utilize large amounts of silicon real estate on the device under test (DUT) or probe. Additionally, the bit error rate for testing purposes must be extremely low.

The use of RF based interconnects alleviates the need to reduce the number of touch downs on signal i/o (input/output) pads. Further, as has been discussed, KGD levels improve dramatically since a more thorough wafer level test is performed. These two benefits combine to suggest RF based interconnects provide a means for improving SiP process test flow and consequently manufacturing yields.

The method of wireless communication is not limited to inductive coupling, however. It is possible to use other forms of near-field communication, such as capacitive coupling, for communication. As well, far-field communication is also a viable technique, where one antenna receives far-field radiation from a transmitting antenna. Further, optical methods such as lasers, photo diodes, and electro-optic components may be used to couple electronic circuits. Another methods involves the use of magnetics such as high speed magnetic circuit (MR, GMR, TMR, etc.) components to couple electronic circuits.

One method for improving manufacturing yields is to perform tests of the SiP during the manufacturing process flow. Such testing enables defects to be identified early in the process and rework and repair to be affected or the component can be discarded and reduces the cost of the discard by eliminating additional process steps and their associated additional value. The implementation of a process flow with just one repair step can have a significant impact on manufacturing yield. SiP's are manufactured with materials that are susceptible to probe damage in the same way as CMOS VLSI integrated circuits.

However, wireless access has limitations. One limitation is that there may be a need to provide power to the device being accessed. A limited amount of power can be provided without physical contact to a chip undergoing access, for example, but the amount of power may be inadequate for accessing of complex multicomponent circuits on such a chip. Hence it would be more beneficial to develop a method for accessing electronic components in which the probe can be configured to interface one or both of wireless access and a wireline access methods.

One method to allow physical probing without causing damage is to "ruggedize" the physical contact. For example, use thick metal that will withstand multiple touchdowns or metallurgy that is not compatible with standard manufacturing techniques for integrated circuits but may be applied in a post process. Such metallurgy may include gold contacts, tungsten contacts, etc.

System-in-Package Testing

The testing of SiP modules is a significant and growing problem in the electronics manufacturing industry. In only eight years SiP packaging has grown from less than 5% to nearly 50% of the packaged IC market. Thus SiPs and SiP testing have become multi-billion dollar industries in a very short time. The Semiconductor Industry Association (SIA) defines a SiP as any combination of semiconductors, passives, and interconnects integrated into a single package. SiP economics are based on the ability to combine multiple different technologies (active and passive) into a miniature package.

SiPs are analogous to PCBs (printer circuit board) in the sense that multiple chips and passives are combined using one substrate. SiPs use passive substrates and various technologies combined in a miniature package, including Si, SiGe, 0.13 um, 0.25 um, digital, analogue, RF, bare die, flip chip ICs, etc. However, unlike PCBs the miniature size of SiPs precludes normal testing as the signal connections and the IC pads themselves are miniature and inaccessible, or occupied. Based on experience during development of the IC industry, the cost of testing a SiP is anticipated to grow more quickly than its manufacturing cost as SiPs evolve into more complex designs.

A SiP has the functional complexity comparable to a populated PCB, combined with the inability to provide access or test points for internal signals. Classical PCB testing has evolved to improve test time and coverage by providing the concept of a Test Access Port (TAP), which gives access to signals on the PCB. The test access port, for which the most common standard is JTAG IEEE 1149.1, is used to assist in fault location and thus enable PCB repair and retest in an efficient manner. Repair and retest of SiPs is not viable given their assembly and construction methods. Testing a SiP is not the same as testing an IC. SiP testing has the challenges similar to system or PCB level testing combined with the technical challenges of chip testing. An example of the latter is the fine placement of test probes required for SiP testing. The inherent flexibility of SiP level integration means that specific ICs included on a SiP are changeable with a smaller non-recurring engineering (NRE) investment than that of a monolithic solution. This means that SiP testing methods must be flexible as well. The design-for-test of single monolithic ICs is not available in SiPs as SiPs typically do not use fully customized ICs. Like PCB testing, IC testing has evolved to include boundary scan testing which is included on many chips and built into the JTAG standard for testing. IEEE 1149.1. JTAG TAP techniques allow for the testing of ICs on PCBs without the need to individually probe IC pins.

Package Testing

The earlier mentioned PCB and IC test issues continue for SiP packaging where a set of VLSI ICs, and discrete components are placed onto substrates to create a compact system. SiP assembly includes bare die and flip chip techniques to provide very high levels of system integration in a physically small but low cost package. Additionally, passives can be included as separate parts or even integrated in the SiP substrate. The substrates used in SiPs are evolving along the same path as that of ICs with finer features and greater complexity. The ability to produce large numbers of SiPs simultaneously on a single wafer produces a bottleneck as SiP testing is currently done serially.

The addition of each IC to a SiP substrate has a negative impact on yield during production. Typically, the final packaging is done without the ability to test devices as they are added to the SiP substrate. Even when there is the ability to test devices as they are added to SiPs it is currently not done because of yield loss due to the potential for damage resulting from multiple test probe touchdowns. SiP probe testing requires touchdown and scrubbing of IC Pads. Scrubbing creates some damage on pads, which affects their ability to be wirebonded to the SiP. Another cost is that there is a need for multiple probe card designs for each manufacturing step or individual SiP design. A further reason pre-package testing is limited in manufacture of SiPs is that the number of signals/pads is large if they are individually tested. Additionally, if IC pads on SiPs were accessible for massively parallel contact probe testing there would be yield loss in subsequent wirebonding-manufacturing steps. Even without these issues it is difficult to conceive of how intermediate tests can be done using physical contact methods because of the three-dimensional nature of the SiP assemblies and mixed technologies (flip chip, wire bond, surface mount, discrete etc.) used in manufacturing SiPs. While technology is available to enable such testing, the costs would be very high, requiring investment in multiple multi-level custom probe cards, test stations and time which would be detrimental to SiP economics.

The growth in SiP design wins is driven by cost and the ability to produce miniature yet advanced products. Using Known Good Dies (KGD) is a way to increase yield in products. However, for SiPs it is not always possible or feasible for cost and test time reasons. Thus, for economic reasons, electronics manufacturers often use untested SiPs, partially tested or only wafer tested dies. This means that there is an enhanced level of rejected components, and resultant waste, built into the SiP manufacturing process as it is currently practiced. Because SiPs are normally tested only after packaging, a test coverage gap is created between the starting dies and the final packaged SiP. This gap or test blindness zone can cause problems especially on large volume products, which is the main target of SiP technology. Thus yield improvement is very difficult, and the invested assembly and packaging cost is invested on all units, including nonfunctional ones. Without mid stream testing there is no opportunity to cull defective devices early in the manufacturing value chain. The complete packaging investment is wasted on non-functional SiPs, whose condition is only visible at the end of the packaging process. Yield loss when mounting dies or passives remains invisible without the ability to do test during production. With half of all packaged systems being SiPs, and SiPs only being tested after assembly, there are severe economic costs arising from test blindness.

Thus there is a need for a fast, flexible, and nondestructive method and apparatus for testing of electronic components, such as SiPs.

SUMMARY

According to one aspect there is provided an apparatus for interrogating an electronic component. The apparatus has a body functioning as a test access port or system access port secured to an electronic component and hardwired to circuits of the electronic component. The body has an interface with an antenna for communication with a non-contact wireless probe of an interrogating device. The body also has a logic circuit for converting instructions into control signals, communication signals or both to be applied to the electronic component.

According to another aspect there is provided a method for interrogating an electronic component. A first step involves providing a body functioning as a test access port or system access port, the body having an interface with an antenna for communication with a non-contact wireless probe the body having a logic circuit for converting instructions into control signals, communication signals or both to be applied to the electronic component, the body being separate and distinct from the interrogating device. A second step involves securing the body to an electronic component and hardwiring the body to circuits of the electronic component. A third step involves performing multiple discrete interrogations of the electronic component via the interface of the body without the interrogating device physically touching the electronic component.

Integrated circuit conductive structures commonly used in modern integrated circuits to couple electronic signals are very fragile and subject to damage during mechanical probing. Damage of the structure can cause failure of the integrated circuit. Further, the mechanical stresses associated with mechanical contact to the structure often induces stresses into the integrated circuit beyond the conductive structure itself leading to additional failure modes of the integrated circuit. Repeated physical contact causes wire bond failure and leads to reliability problems. The approach advocated with the present method and apparatus provides a durable interface that can be interrogated as many times as may be necessary to complete a series of discrete testing protocol. This interrogating can be through wireless probing, physical probing or a hybrid approach involving both.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 1a is a block diagram of a first embodiment of an apparatus for interrogating an electronic component.

DETAILED DESCRIPTION

Figure 1B:
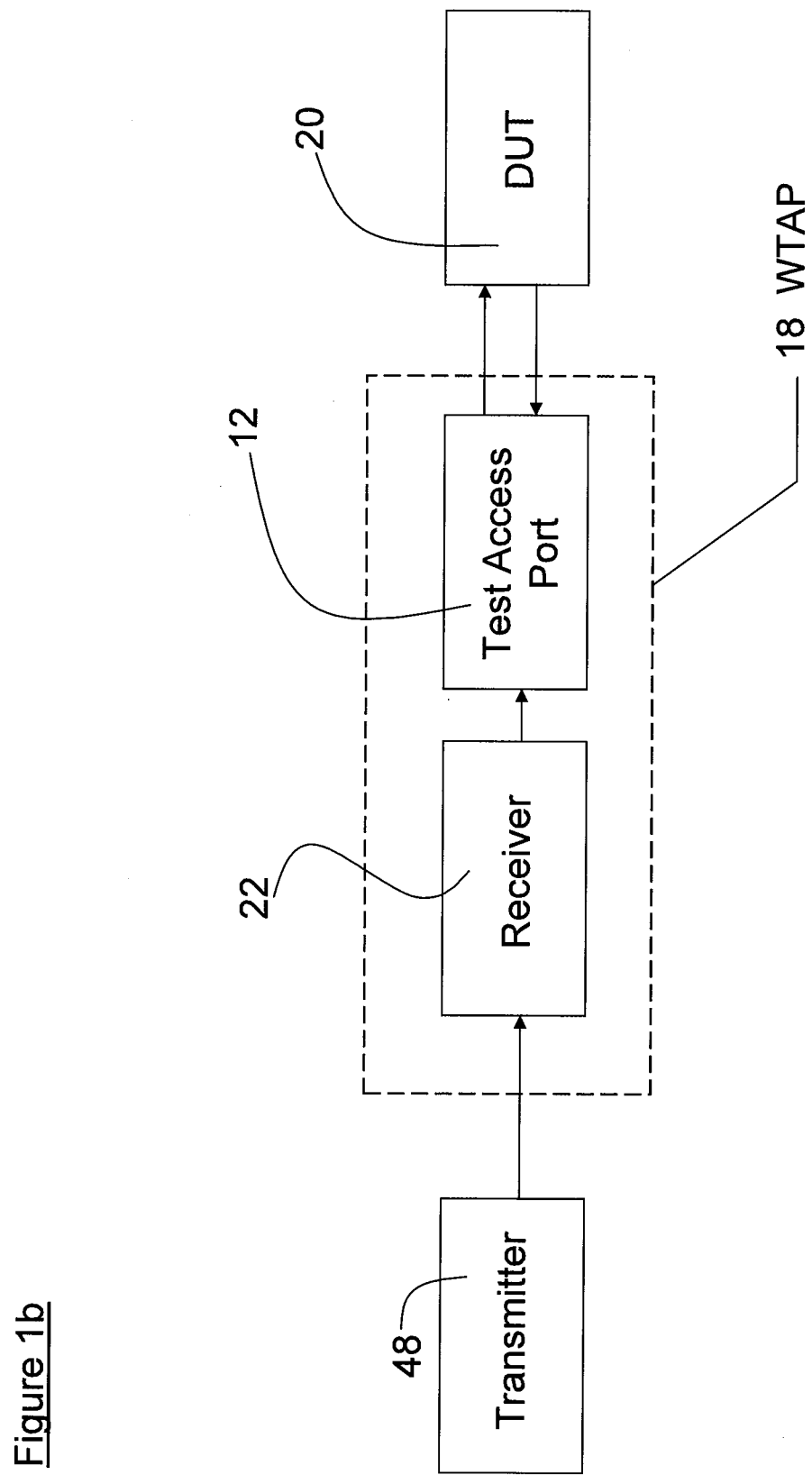
FIG. 1b is a block diagram of a second embodiment of an apparatus for interrogating an electronic component.

A method and apparatus for interrogating an electronic component will now be described. The Apparatus consists of a body having an interface for an interrogating device to use as a conduit in reliably performing multiple discrete interrogations of the electronic component without the interrogating device physically touching the electronic component.

The approach advocated with the present method and apparatus provides a durable interface that can be interrogated as many times as may be necessary to complete a series of discrete testing protocol. This interrogating can be through wireless probing, physical probing or a hybrid approach involving both. Probing approaches previously patented include wireless methods as described in U.S. Pat. No. 6,885, 202 and hybrid methods as described in U.S. Pat. No. 7,109, 730. There are a number of ways that the teachings concerning the method and apparatus can be put into practice, as will be hereinafter further described.

The wireless method involves the use of two core components, preferably incorporated into a single body: a wireless communication block (WCB), and a device access port (DAP) or a test access port (TAP). Since a TAP is a special case of the more general DAP, it will be understood that the two terms may be used interchangeably in the drawings and the description below. The WCB is used as an interface to wirelessly communicate with an interrogating device, such as a probe. The DAP or TAP is used to directly communicate with or test an electronic component (device under test—DUT).

The contacting method involves the use of a contact pad as an interface on the electronic component (DUT) that is in electronic communication with the integrated circuits thereon, and a probe in electronic communication with automated test equipment (ATE). The entire system may be referred to as a system access port (SAP), which is shown generally in FIGS. 21 through 23.

Figure 10:
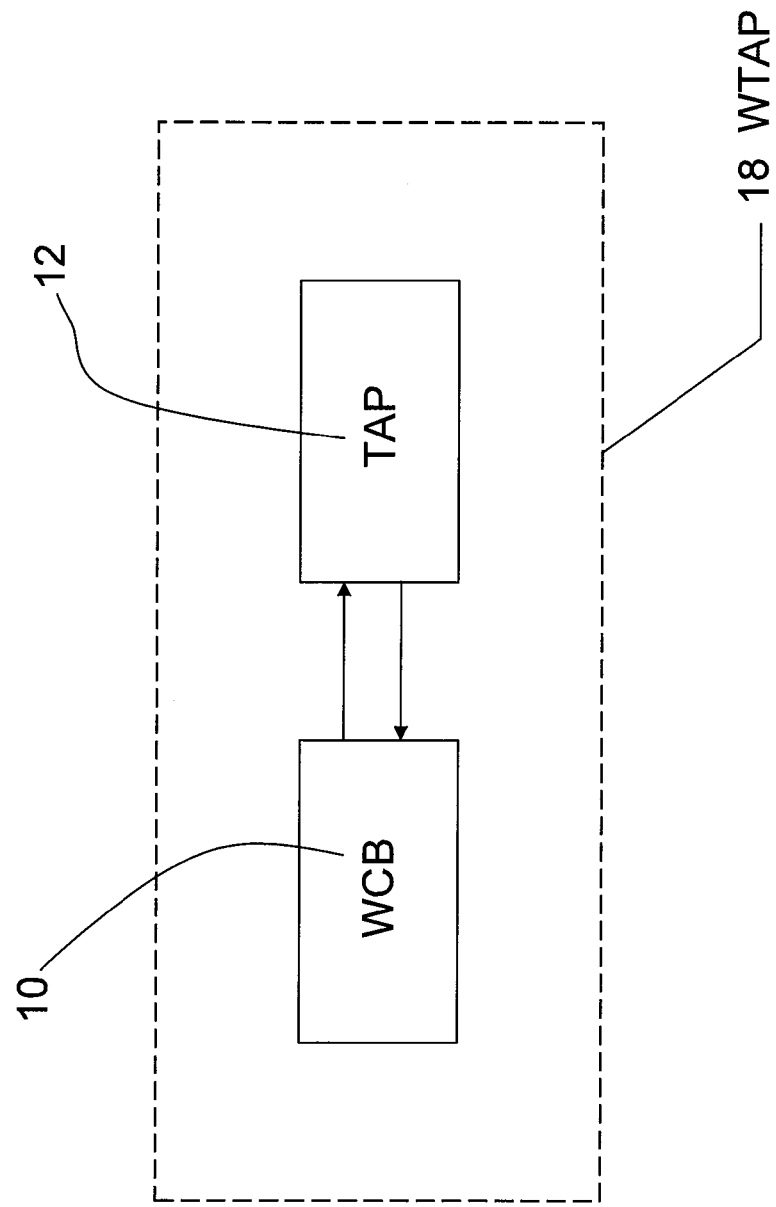
FIG. 10 is a block diagram of an apparatus for interrogating an electronic component suitable for mapping, having one wireless communication block and one test access port.
Figure 11:
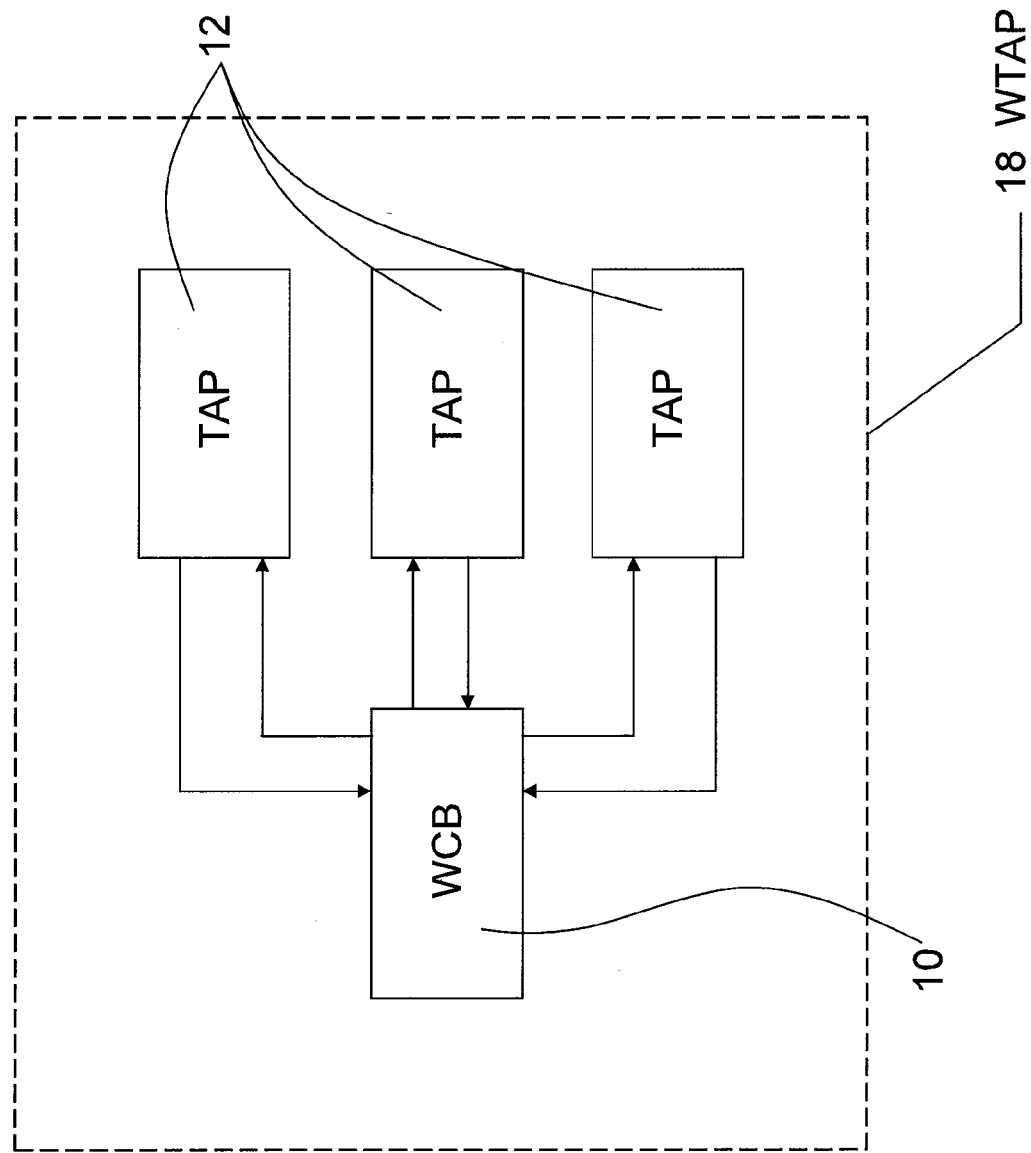
FIG. 11 is a block diagram of a more complex an apparatus for interrogating an electronic component having a single wireless communication block and multiple test access ports, suitable for testing multiple devices under test in parallel, or to add redundancy.
Figure 12:
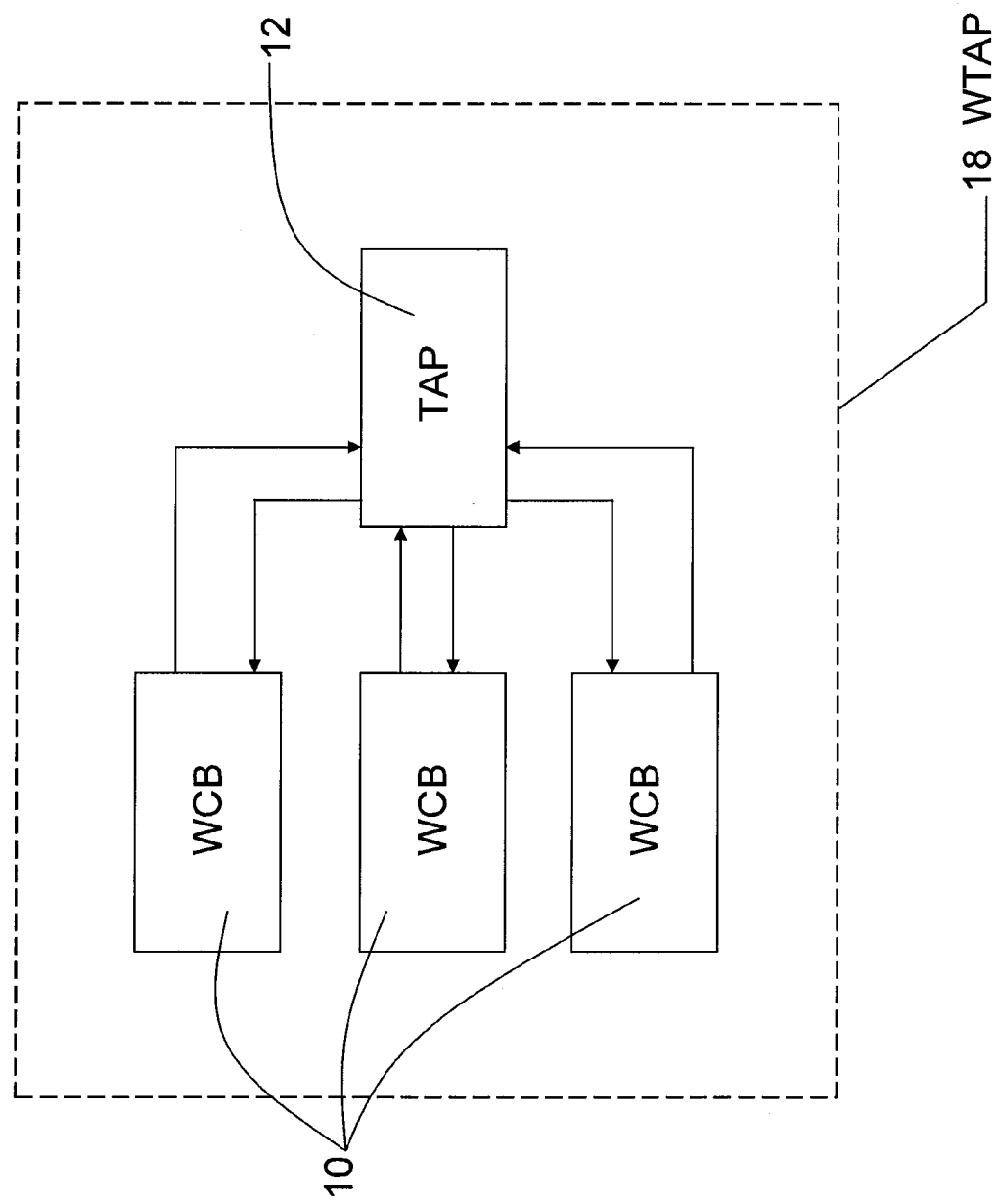
FIG. 12 is a block diagram of an even more complex an apparatus for interrogating an electronic component having multiple wireless communication blocks and a single test access port, for transmission of data in parallel to multiple test probes.
Figure 13:
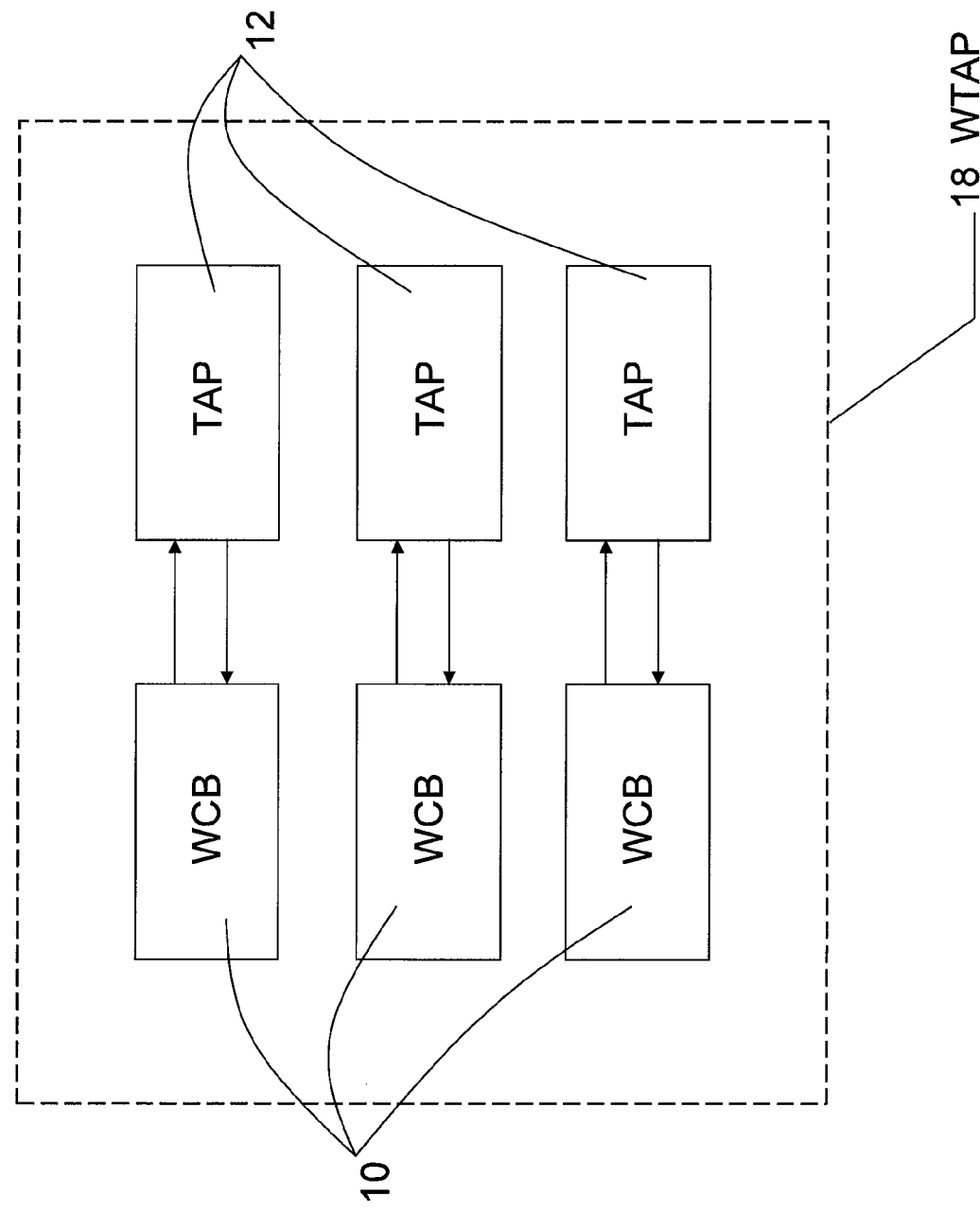
FIG. 13 is a block diagram of an even more complex an apparatus for interrogating an electronic component having multiple wireless communication blocks and multiple test access ports.

There are generally two approaches to communication that may be considered when using different embodiments for the wireless component of SAP 100. The first is the concept of "mapping" for which there may be one transmitter 16 and/or one receiver 22 for one device access port (DAP) 12 as shown in FIG. 10, where the WCB 10 represents the transmitter 16 and the receiver 22, one transmitter 16 and/or one receiver 22 for multiple DAPs 12 as shown in FIG. 11, multiple transmitters 16 and/or multiple receivers 22 for one DAP 12 as shown in FIG. 12, or multiple transmitters 16 and/or receivers 22 for multiple DAPs 12 as shown in FIG. 13. These four variations respectively are described as:
  i) One-to-One mapping
  ii) One-to-Many mapping
  iii) Many-to-One mapping
  iv) Many-to-Many mapping The second concept is that of placement and separation. While there can be any sort of mapping between transmitter 16 and/or receiver 22 and DAP 12, they can be located in many different places. Six such examples are:
  i) Transmitter 16 and/or receiver 22 and DAP 12 on the same chip
  ii) Transmitter 16 and/or receiver 22 and DAP 12 on separate chips, but both mounted on the same semiconductor substrate
  iii) Transmitter 16 and/or receiver 22 and DAP 12 on the same semiconductor substrate
  iv) Transmitter 16 and/or receiver 22 on one semiconductor substrate, DAP 12 on another, and communication between semiconductor substrates within the same package
  v) Transmitter 16 and/or receiver 22 and DAP 12 on the same substrate
  vi) Transmitter 16 and/or receiver 22 on one substrate, DAP 12 on another, and communication between substrates It will be recognized that the description of the embodiments below may be modified by using either of mapping and placement and separation, or both. Furthermore, these concepts may be applied to nearly every component within the wireless communication block (WCB) 10 and DAP 12, their interfaces, and the WCB/DAPs themselves.

Referring to FIGS. 1 through 20, the major components of wireless testing are part of a body which will hereinafter be referred to as wireless test access ports (WTAP) 18 will be described first. Some possible embodiments and illustrative applications will then be described. Following these descriptions, the system access port (SAP) 100 will be described with reference to FIGS. 21 through 23.

Components of Wireless Test Access Ports

A wireless communication block (WCB) 10 is used to wirelessly transmit and receive data to/from a test probe. While the embodiment described below is a testing apparatus, it will be understood that the apparatus is used for interrogating components of the System in Package, which includes communications for purposes in addition to testing. The test probe will be described with reference to FIGS. 29 through 31. Techniques for wireless communication at the physical layer involve either near-field (capacitive, inductive) coupling, or far-field (radiation) coupling. Optical or magnetic coupling may also be used.

Figure 19:
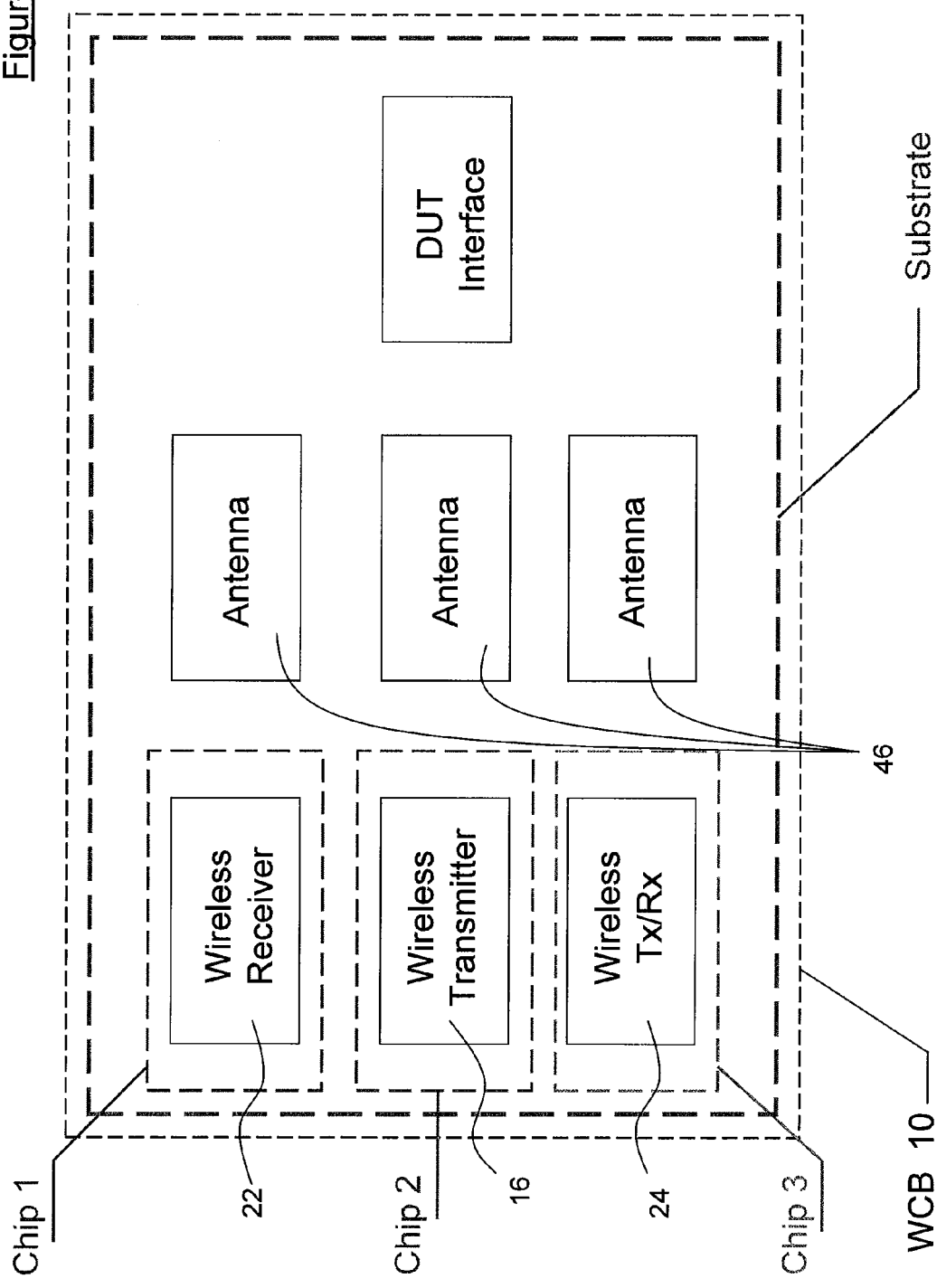
FIG. 19 is a block diagram of an apparatus for interrogating an electronic component having inductors/capacitor plates/antennae that are distinct and separate and built on separate substrates such as chips, boards, substrates, or riser cards.

Referring to FIG. 19, the WCB 10 includes transmission (Tx) 16 circuits to send data to a test probe, receiver (Rx) 22 circuits to receive data from a test probe, and structures 46 for wirelessly transmitting data across a gap (eg: inductive coils, plates to form a capacitor, antennae, etc.). The Tx/Rx circuits may also be combined into a single circuit 24 which performs both tasks. The WCB 10 may be designed to communicate with a test probe wirelessly. As well, referring to FIG. 10 through 13, it communicates with one or more TAPs 12 using DC coupling (wireline interconnects).

Figure 4:
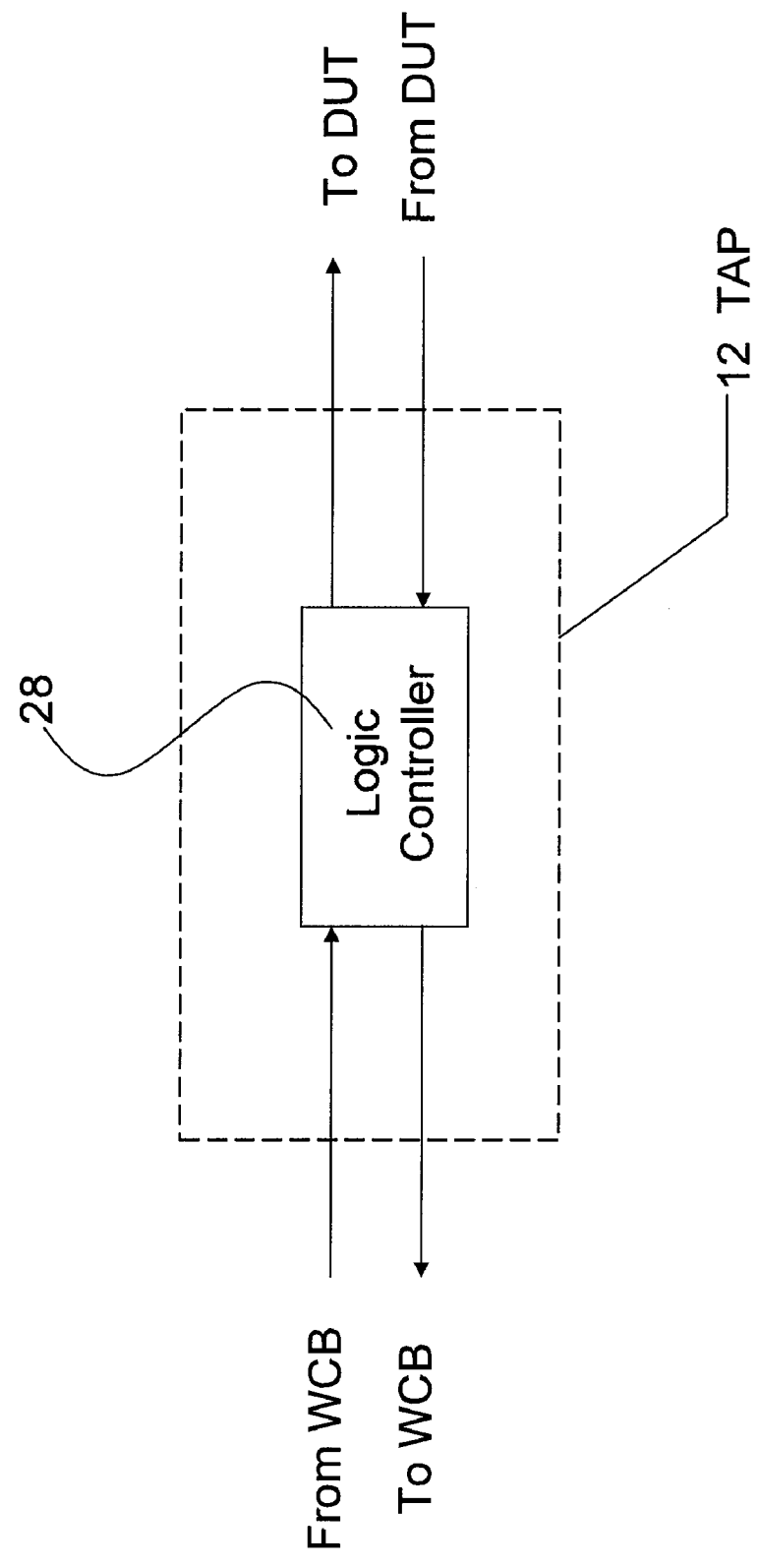
FIG. 4 is a block diagram of an apparatus for interrogating an electronic component that has a logic controller.

Referring to FIG. 4, the test access port (TAP) 12 is a circuit for controlling the process of test on a DUT 20. Information such as instructions or data are issued to a TAP 12, and TAP 12 converts the information into control signals and test vectors which are sent to a device under test (DUT) 20. TAP 12 receives output signals from DUT 20, and these signals can be processed and sent back to test probe 26 via wireless communication using the WCB 10. The TAP 12 includes Tx and Rx circuits (not shown) to communicate with the WCB 10. It also includes logic structures, such as logic controller 28, which convert input instructions and data into control signals and data which can be applied to a DUT 20.

Figure 5:
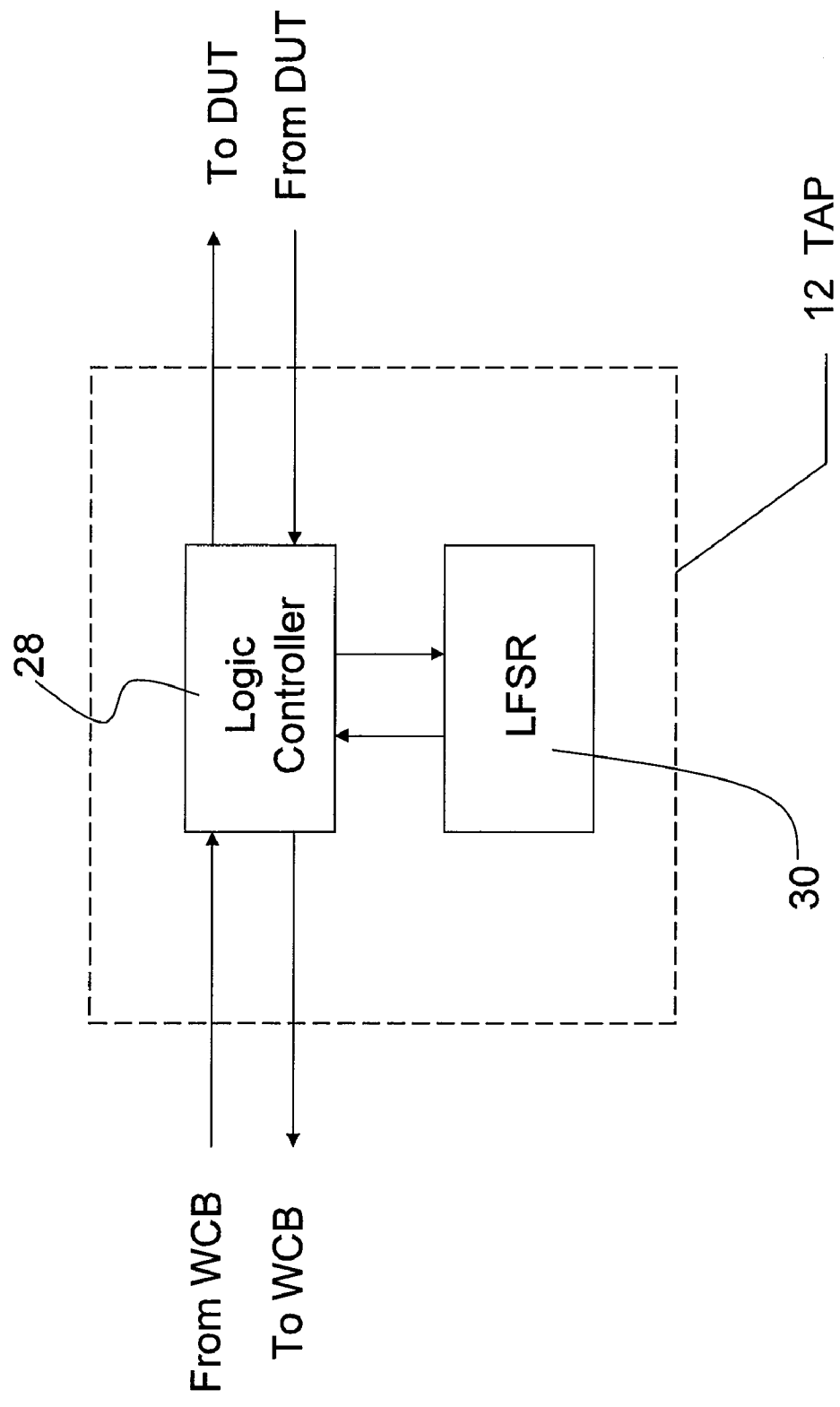
FIG. 5 is a block diagram of an apparatus for interrogating an electronic component having a linear feedback shift register for random instruction/data generation.
Figure 6:
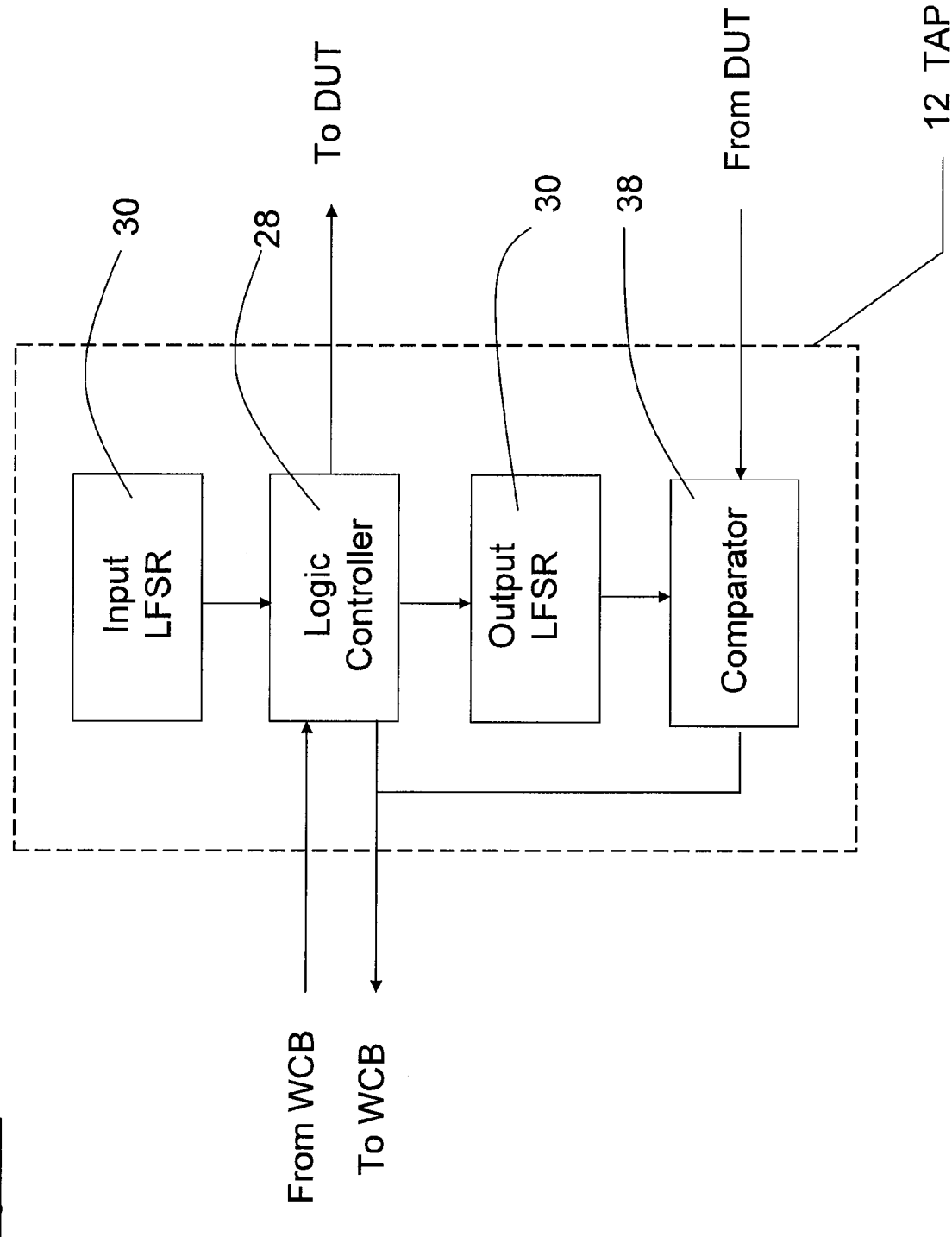
FIG. 6 is a block diagram of an apparatus for interrogating an electronic component that has ability to check the output from the device under test itself, without the need to send data back to the test probe.
Figure 8:
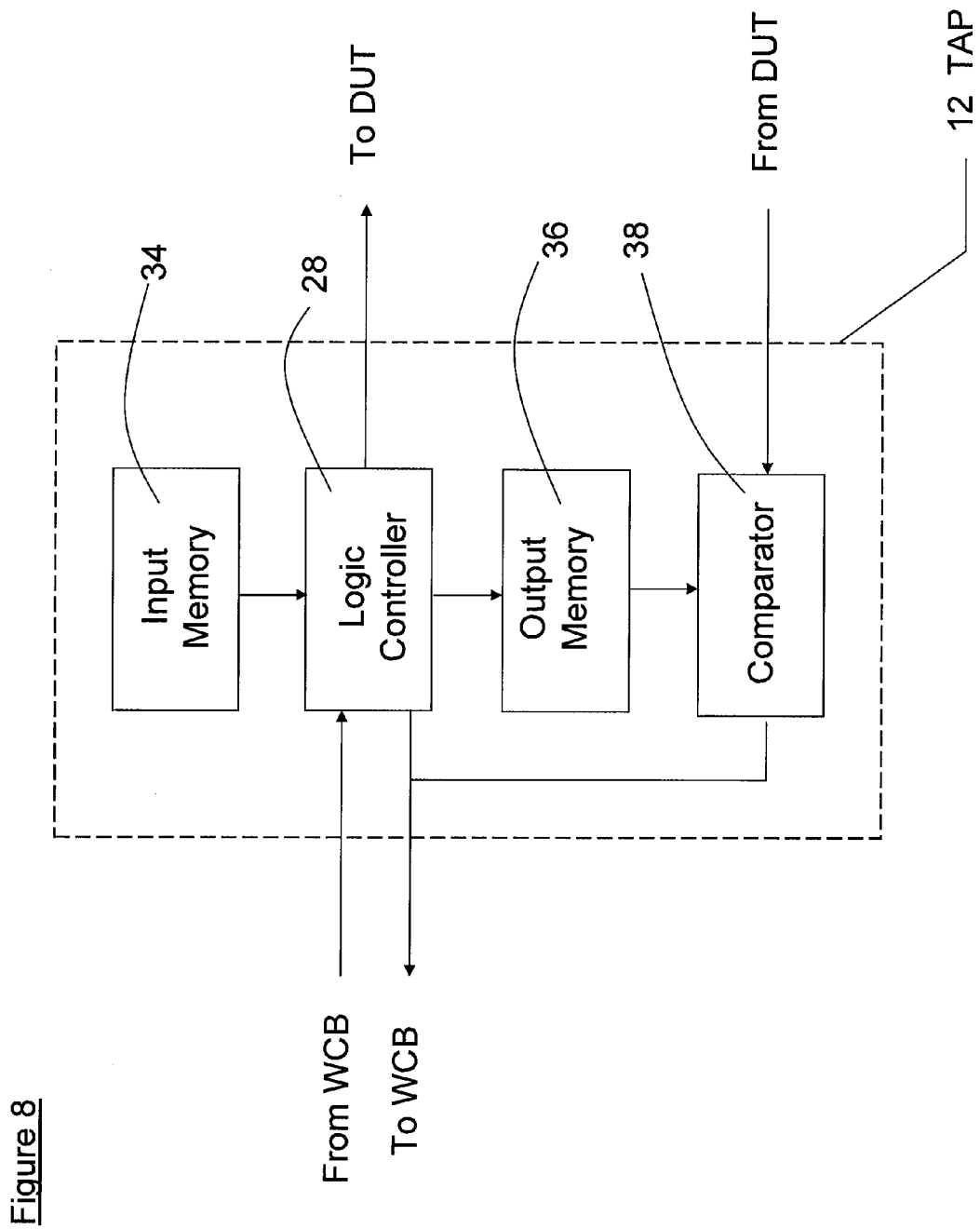
FIG. 8 is a block diagram of an apparatus for interrogating an electronic component having a memory circuit which stores input test vectors, and another memory chip which stores the expected results from the device under test.

TAP 12 may include circuits for pseudo randomly generating instructions and data. One type of circuit which can accomplish this is a linear feedback shift register (LFSR) 30, as shown in FIG. 5. Referring to FIG. 8, the TAP 12 may include memory circuits 32, 34, 36 to store predefined instructions and data which can be used to test a DUT 20. Similarly, the TAP 12 may include circuits for verifying the outputs of a DUT 20. Referring to FIG. 6, such circuits include LFSRs 30 which are matched to input LFSRs 30, memory circuits 32, 34, 36 which store the expected outputs corresponding to specific inputs, and comparators 38 to compare DUT 20 outputs to expected outputs. As well, referring to FIG. 9, TAP 12 may include analogue-to-digital (A/D) 40 and digital-to-analogue (D/A) 42 converters for the purpose of testing analogue and mixed signal circuits.

Referring to FIGS. 1a and 10, the TAP 12 communicates with the WCB 10 and DUTs 20 using direct connects (wireline interconnects). As well, it may communicate with one or more DUTs 20 using wireless interconnects.

FIG. 1a shows a block diagram of a wireless test access port (WTAP) 18 having wireless transmitters/receivers 20 and TAP 12. WTAP 18 itself does not include a probe or a device under test (DUT) 20, but interfaces with each of them.

This design includes both transmitters 16 and receivers 22 on WTAP 18 which communicate with an external receiver 50 and transmitter 48.

FIG. 1b shows a block diagram of an alternative WTAP 18 having receivers 22 on WTAP 18.

Figure 1C:
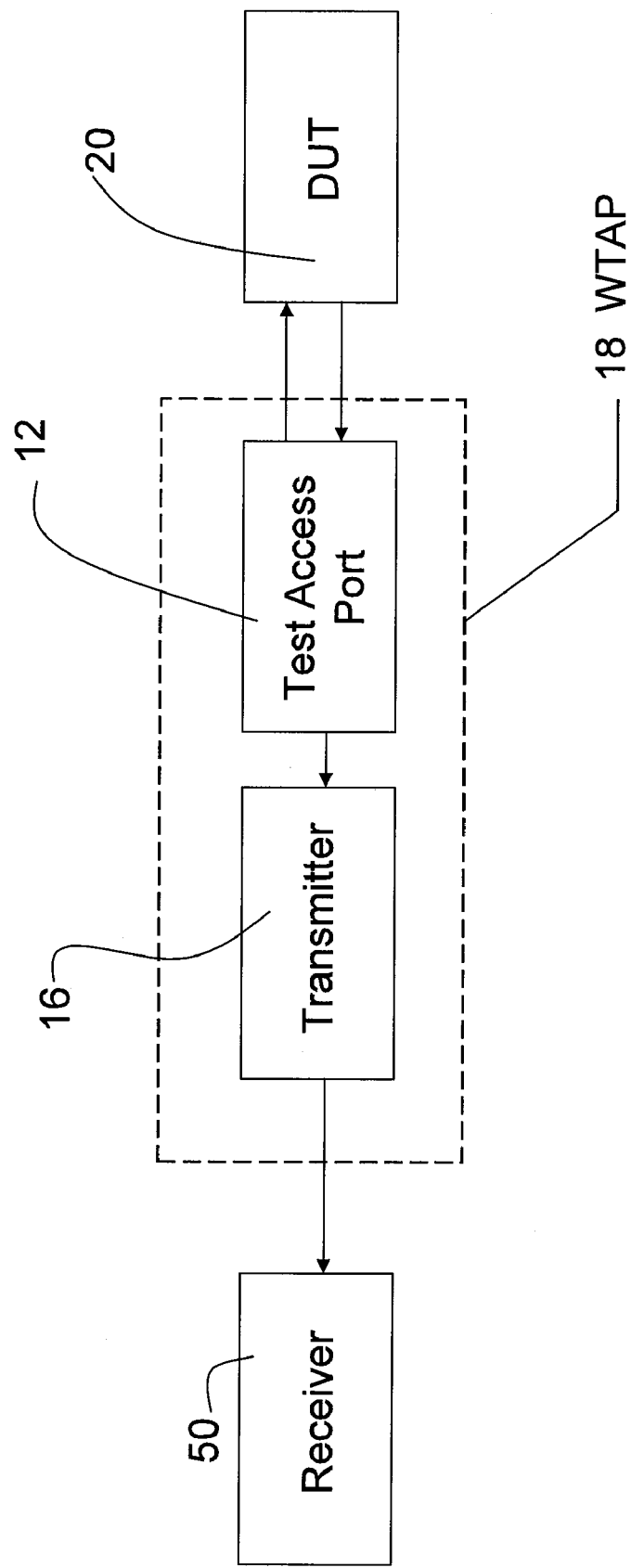
FIG. 1c is a block diagram of a third embodiment of an apparatus for interrogating an electronic component.

FIG. 1c is a block diagram of another WTAP 18 having transmitters 16.

Figure 2:
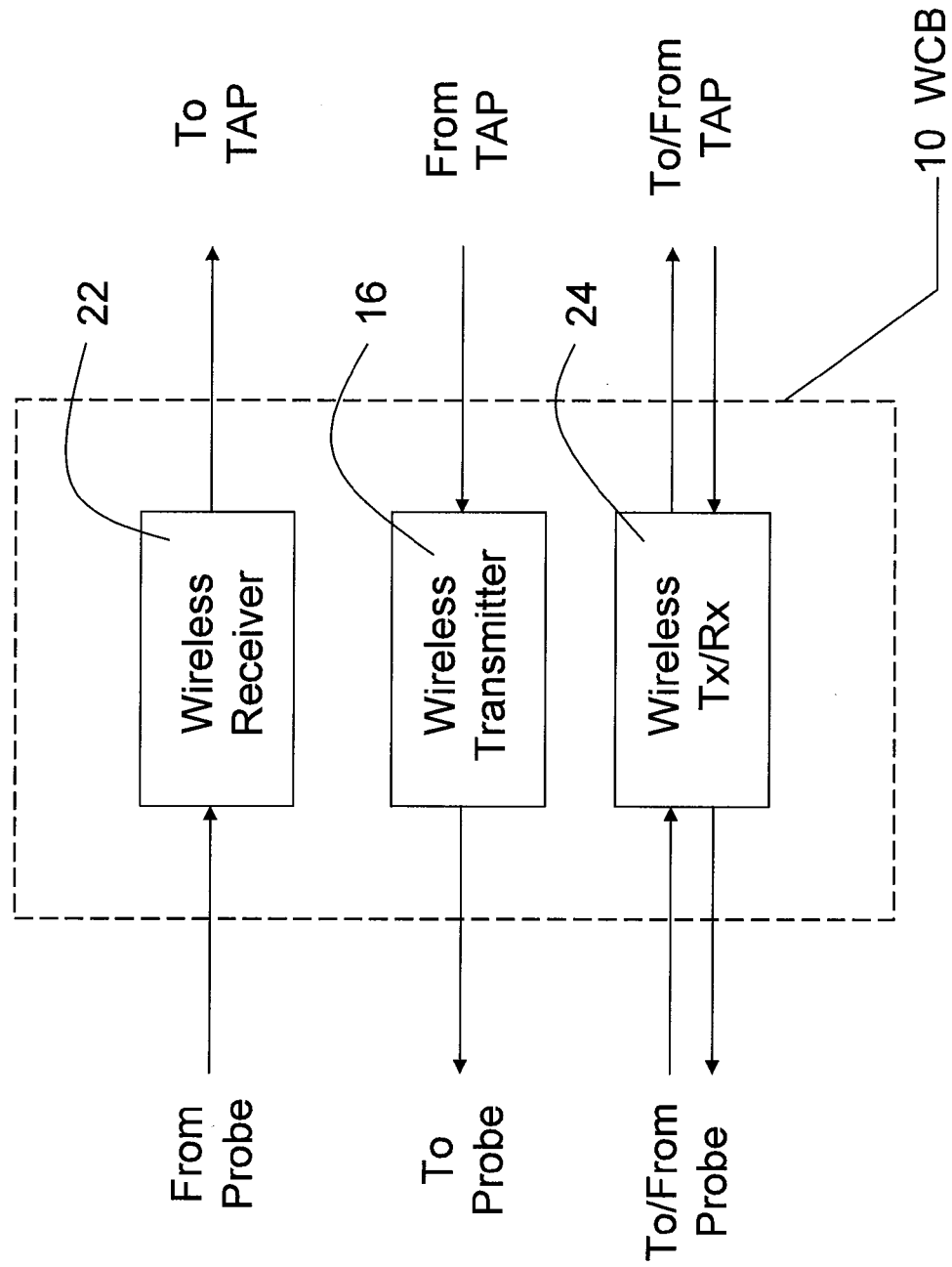
FIG. 2 is a block diagram of an apparatus for interrogating an electronic component with an interface in the form of a wireless communication block having a transmitter and a receiver or bidirectional transmitter-receivers.

The internals of a wireless communication block (WCB) will now be described with reference to FIGS. 2 and 3. FIG. 2 shows a block diagram of WCB 10 having transmitter 16, receiver 22, or bidirectional transmitter-receivers 24. Transmitters 16 send data to a test probe (not shown), receivers 22 receive data from the test probe (not shown), and transmitter-receivers 24 do both.

Figure 3:
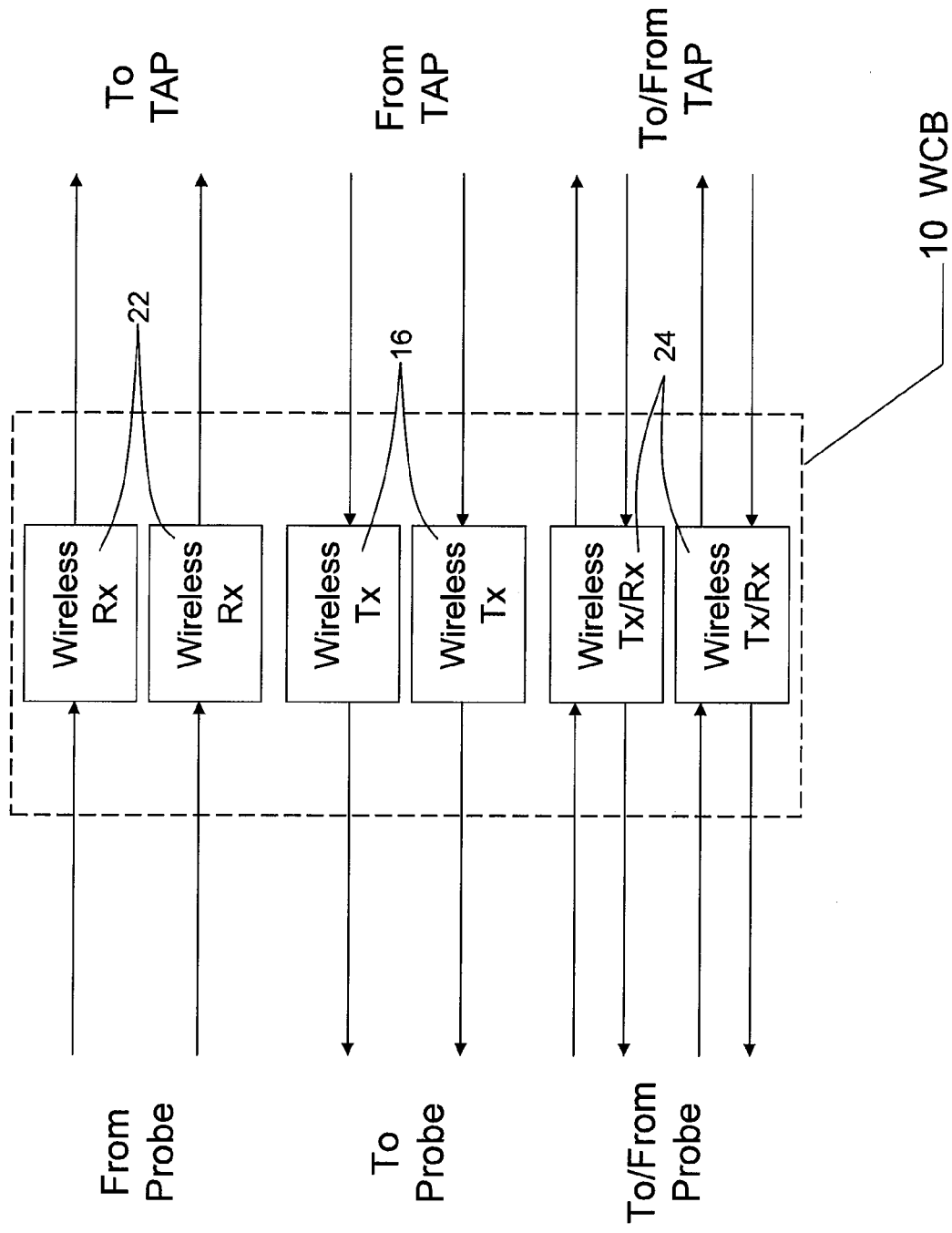
FIG. 3 is a block diagram of an apparatus for interrogating an electronic component with an interface in the form of a wireless communication block having a combination of a plurality of transmitters and receivers, or bidirectional transmitter-receivers.

FIG. 3 shows a block diagram of a more complex WCB 10 having a plurality of transmitters 16, receivers 22, or bidirectional transmitter-receivers 24, which can be in any quantity or combination.

The internals of TAPs will now be described with reference to FIGS. 4 through 9. FIG. 4 illustrates a simple design of TAP 12 comprising a logic controller 28 that receives instruction and data signals from WCB 10, and applies the corresponding control and data signals to DUT 20. FIG. 5 illustrates a more complex TAP 12 that includes a linear feedback shift register (LFSR) 30 for random instruction/data generation. FIG. 6 illustrates an even more complex TAP 12 capable of checking the output from DUT 20 itself, rather than sending the raw output from DUT 20 back to test probe 26. In this case, an input LFSR 30 is used to randomly generate instructions/data which can be applied to DUT 20. The output of DUT 20 is received by TAP 12 and then checked to see if it is correct. This is done by processing the output, then comparing to a separate output LFSR 30 which is matched to the input LFSR 30. With these features the system can operate as a built-in-self-test (BIST) mechanism. Hence, rather than transmitting raw output from DUT 20 back to test probe 26, a BIST generates inputs, checks outputs, and only transmits test reports back to test probe 26

Figure 7:
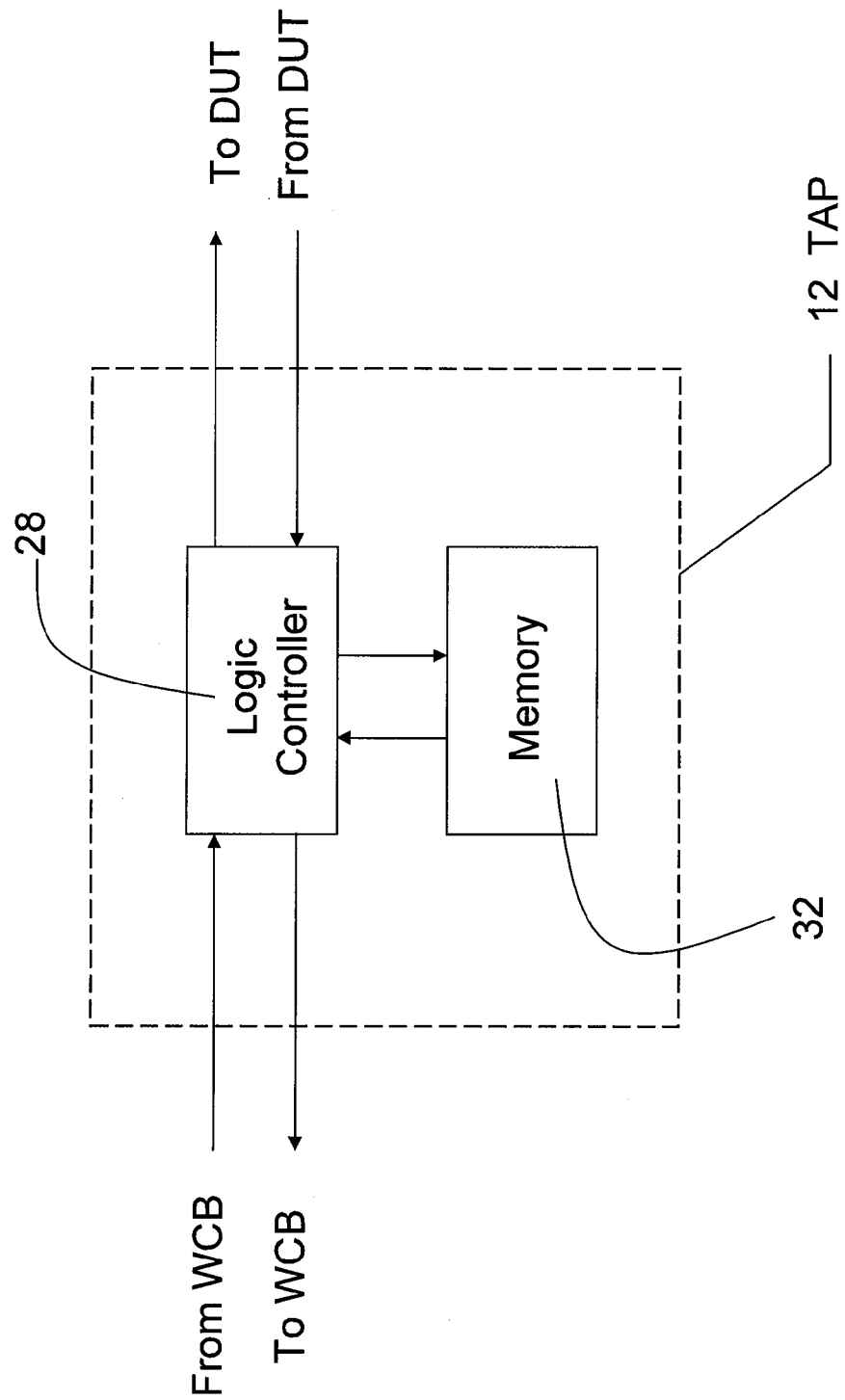
FIG. 7 is a block diagram of an apparatus for interrogating an electronic component having a memory circuit to store test vectors which can be applied to a device under test.
Figure 9:
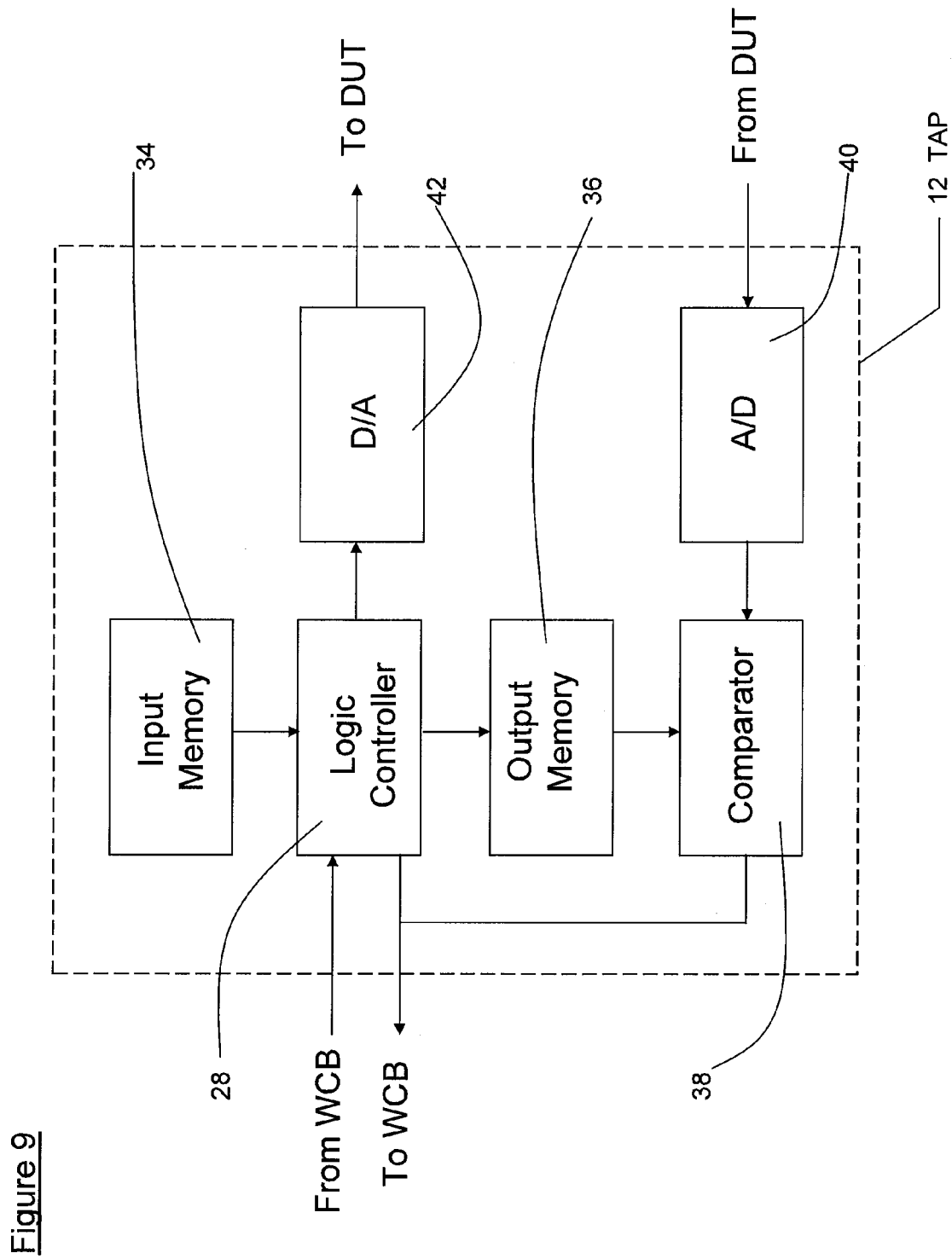
FIG. 9 is a block diagram of an apparatus for interrogating an electronic component for testing analogue and mixed-signal devices, having an analogue-to-digital (A/D) converter and a digital-to-analogue (D/A) converters, and linear feedback shift registers or memory circuits for storing inputs and outputs.

In a further refinement illustrated in FIG. 7, TAP 12 has a memory circuit 32 (e.g.: flash) to store test vectors which can be applied to DUT 20. FIG. 8 illustrates an advanced implementation that includes a memory circuit 32 for storing input test vectors 34, and another memory chip 36 which stores the expected results from DUT 36. The actual outputs are checked against the expected outputs using a comparator 38. FIG. 9 illustrates another advanced design of TAP 12 used to test analogue and mixed-signal devices. In this case, analogue-to-digital (A/D) 40 and digital-to-analogue (D/A) 42 converters are required. Advanced implementations of this design may include LFSRs 30 or memory circuits 32, 34, 36 for storing inputs and outputs.

WTAP for mapping will now be described with reference to FIGS. 10 through 13. A simple WTAP 18 will have one WCB 10 and one TAP 12, as illustrated in FIG. 10. FIG. 11 shows a more complex WTAP 18 having a single WCB 10 and multiple TAPs 12. This design may be used to test multiple DUTs 20 in parallel, or to add redundancy. FIG. 12 shows another complex WTAP 18 having multiple WCBs 10 and a single TAP 12. This WTAP 18 may be used to transmit data in parallel to multiple test probes 26. It should be noted that WCB 10 is a logical abstraction, and it is possible to lump multiple WCBs into a single WCB and maintain the abstraction.

Figure 14:
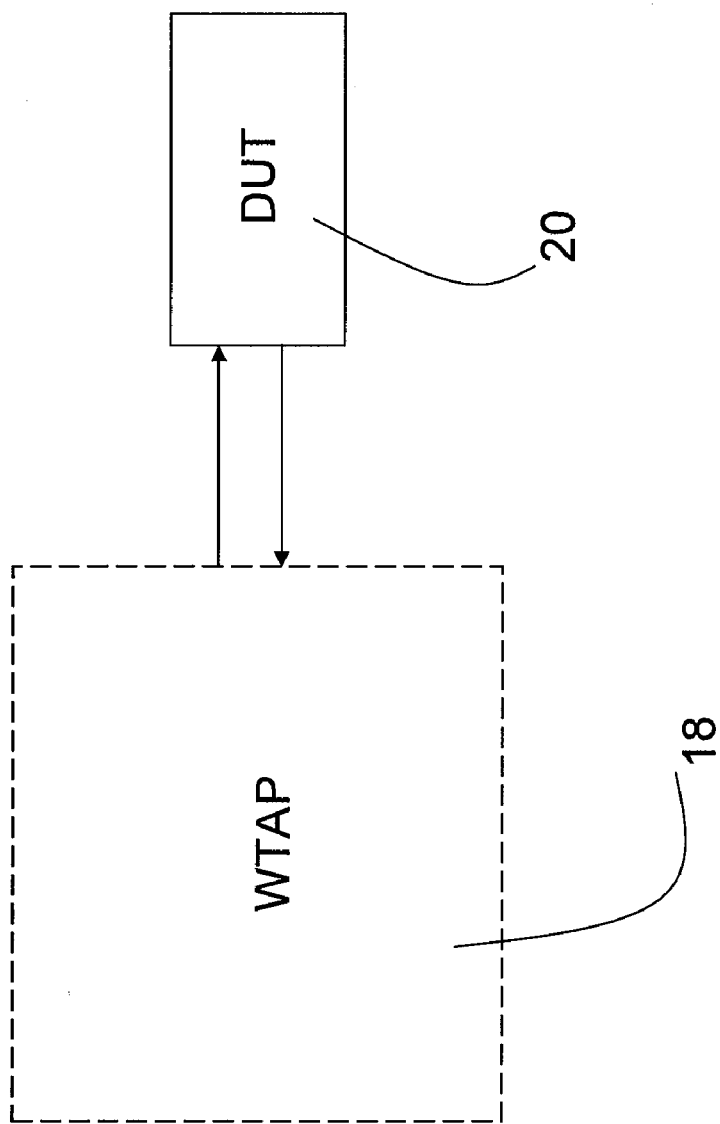
FIG. 14 is a block diagram of an apparatus for interrogating an electronic component designed to communicate with a single device under test.
Figure 15:
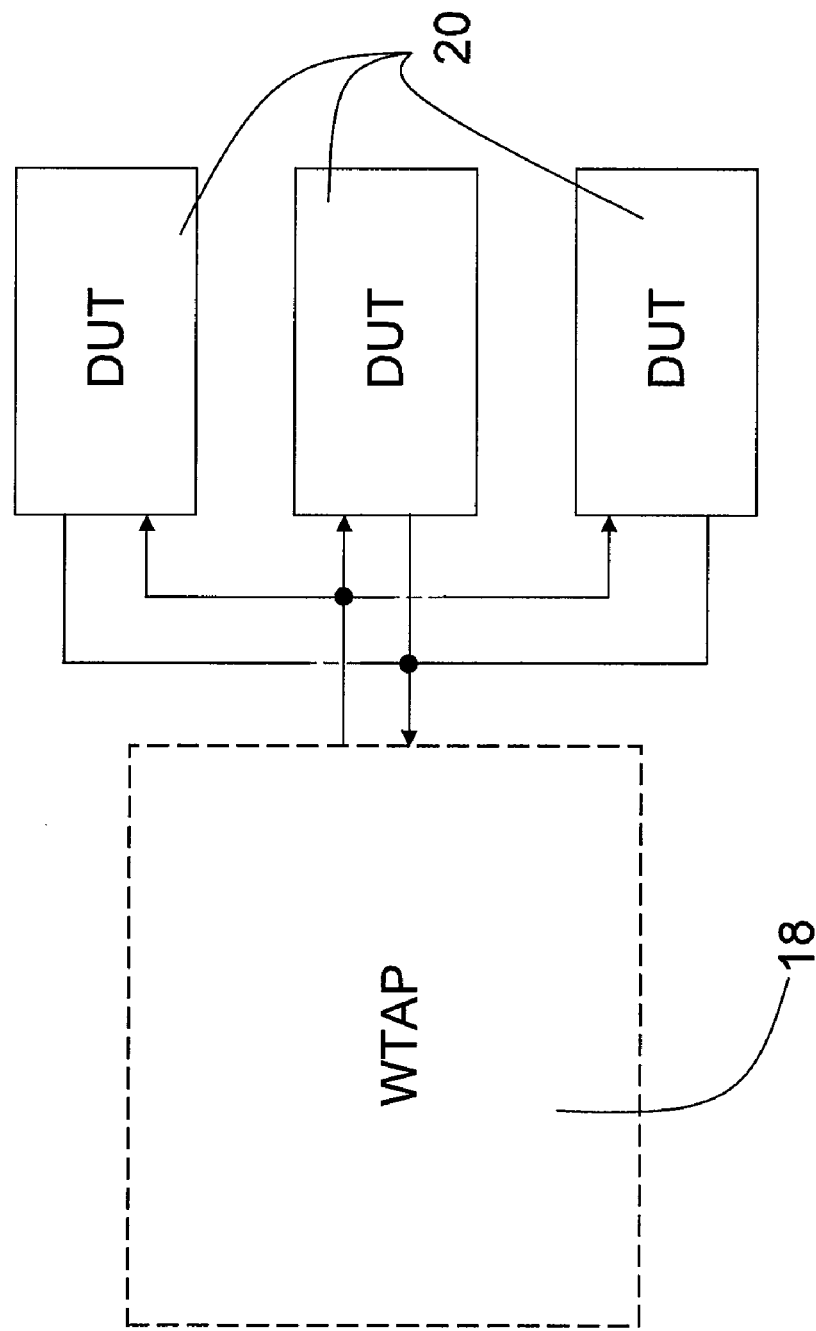
FIG. 15 is a block diagram of an apparatus for interrogating an electronic component designed to communicate with multiple devices under test, having a multiplexer to control which device under test is communicating with the wireless test access port at any given point in time.
Figure 16:
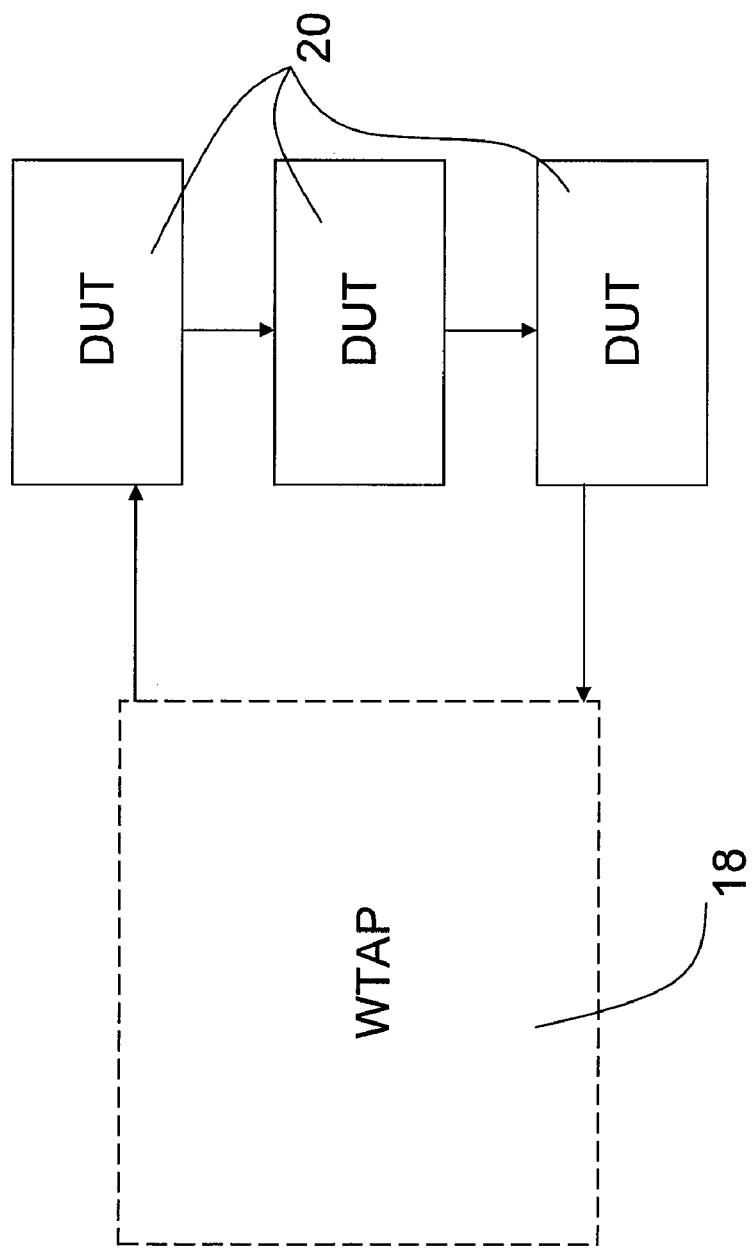
FIG. 16 is a block diagram of an apparatus for interrogating an electronic component in communication with several devices under test chained in series.

FIG. 13 shows a more complex WTAP 18 having multiple WCBs 10 and multiple TAPs 12. Communications between WTAP 18 and DUT 20 will now be described with reference to FIGS. 14 through 16. FIG. 14 illustrates communication between a single WTAP 18 and a single DUT 20. FIG. 15 illustrates a WTAP 18 designed to communicate with multiple DUTs 20. One method of achieving this is to use a simple multiplexer to control which DUT 20 is communicating with WTAP 18 at any given point in time. FIG. 16 shows WTAP 18 in communication with multiple DUTs 20 by chaining them in series. When, for example, DUTs 20 store test inputs/outputs in scan registers, the registers of each DUT 20 can be chained together to form a very large scan chain. This allows a single WTAP 18 to test multiple DUTs 20.

Figure 17:
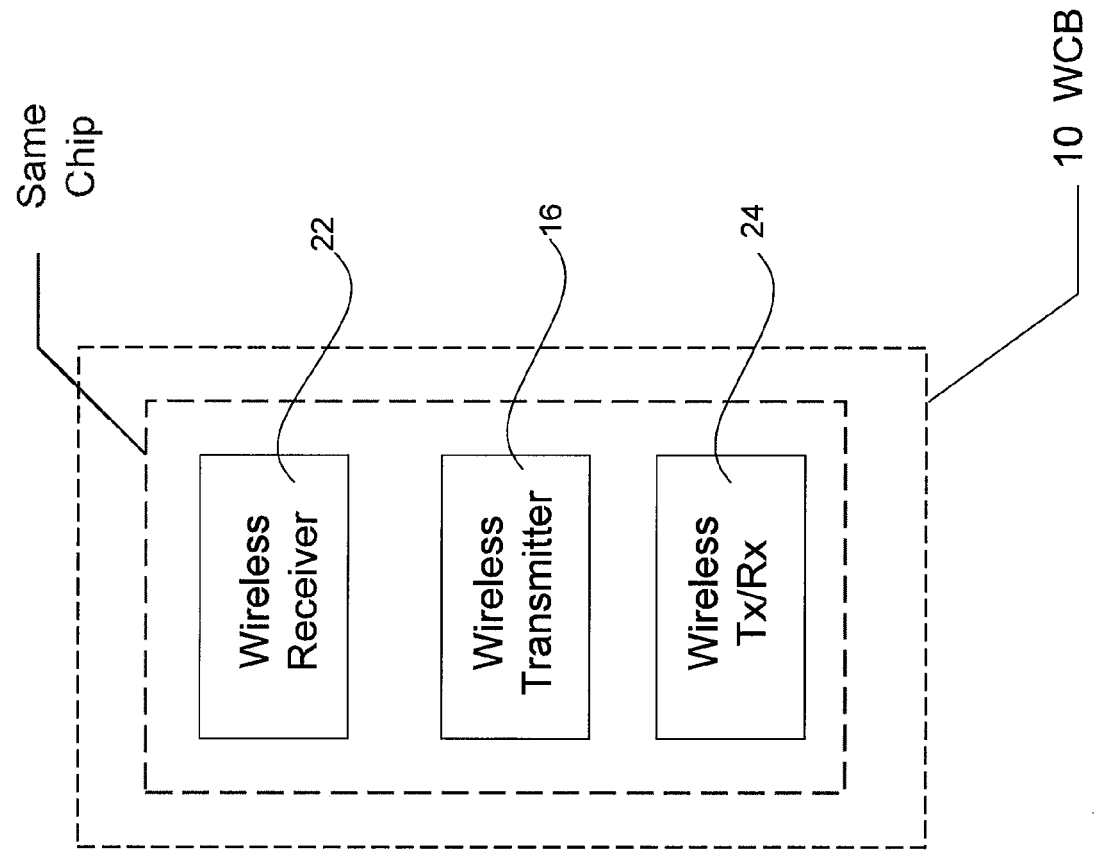
FIG. 17 is a block diagram of an apparatus for interrogating an electronic component having transmitter, receiver, and transmitter-receiver circuits integrated on the same substrate such as a chip, board, substrate, or riser card.
Figure 18:
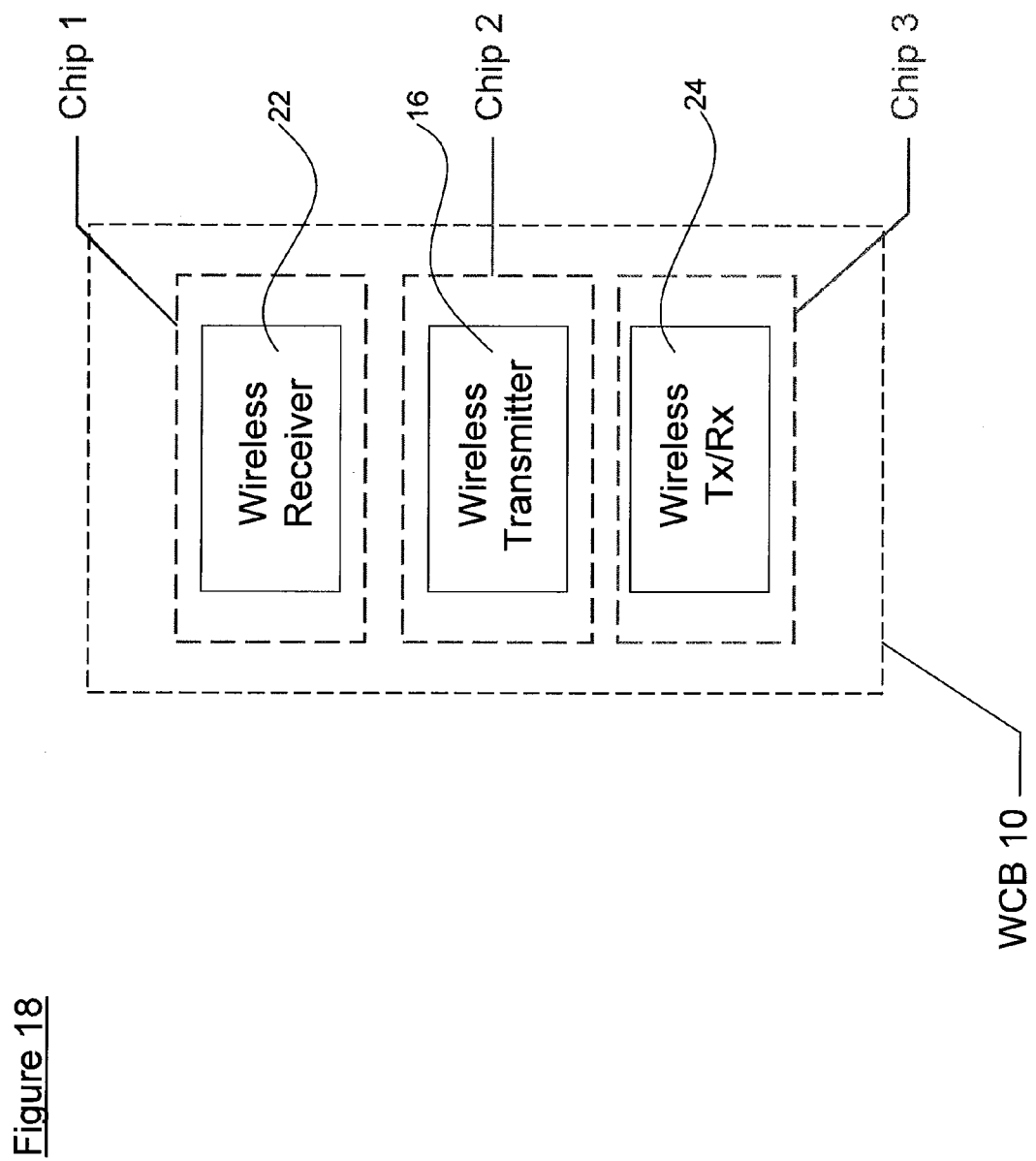
FIG. 18 is a block diagram of an apparatus for interrogating an electronic component having transmitter, receiver, and transmitter-receiver circuits built on independent substrates such as chips, boards, substrates, or riser cards.

Placement of WTAPs will now be described with reference to FIGS. 17 through 19. FIG. 17 shows integration of transmitter 16, receiver 22, and transmitter-receiver 24 circuit on the same substrate 44. Examples of substrate 44 include chips, boards, or riser cards. FIG. 18 shows that transmitter 16, receiver 22, and transmitter-receiver 24 circuits may be built on completely independent chips, boards, substrates, or riser cards. FIG. 19 shows that the inductors/capacitor plates/antennae 46 also may all be distinct and separate, and on separate chips, boards, substrates, or riser cards.

Figure 20:
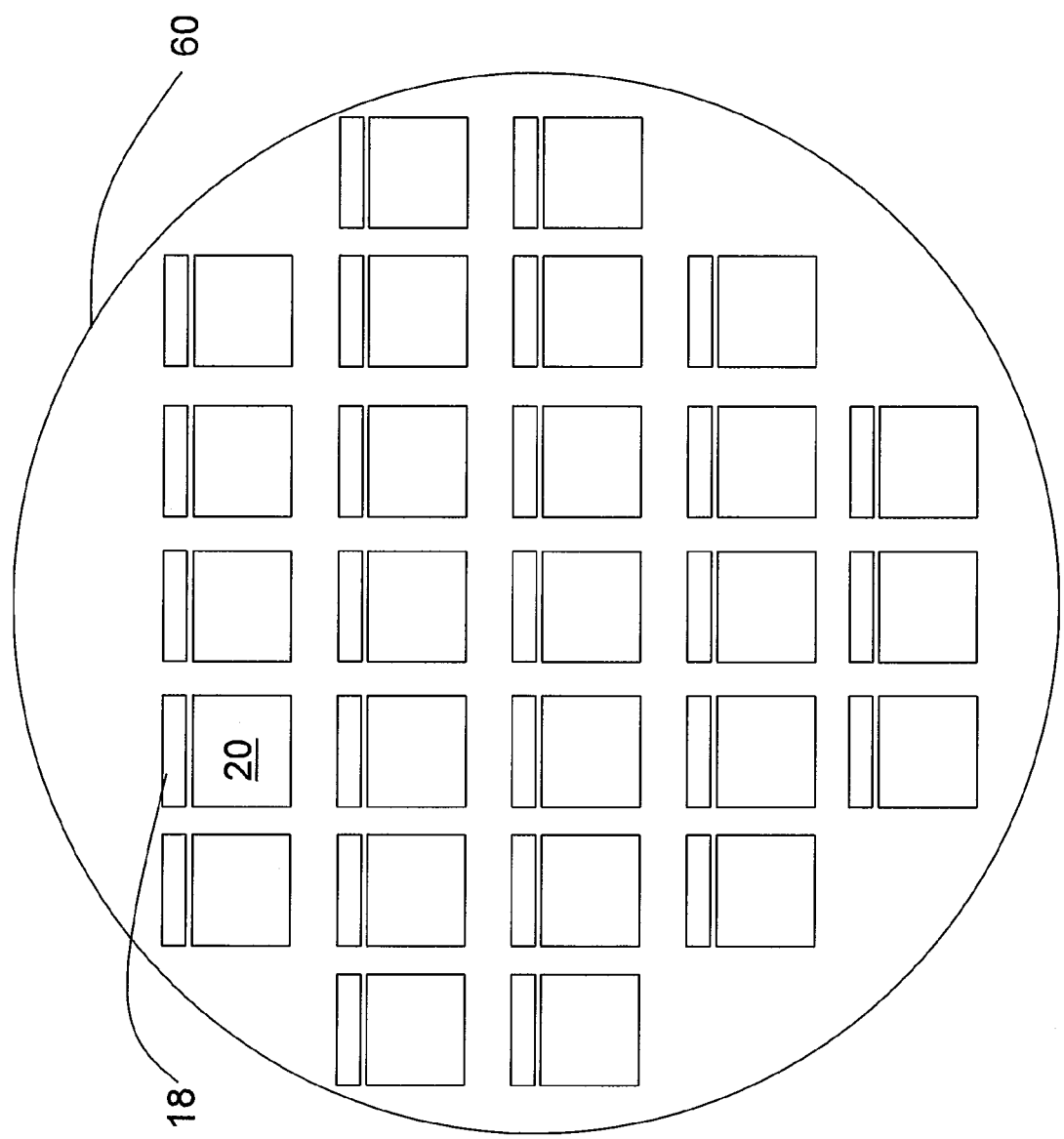
FIG. 20 shows an apparatus for interrogating an electronic component devices under test on a processed but undiced semiconductor wafer.

A plurality of WTAPs 18 and DUTs 20 may be manufactured simultaneously on a processed, but undiced semiconductor wafer 60, as illustrated in FIG. 20.

System Access Port

Figure 21:
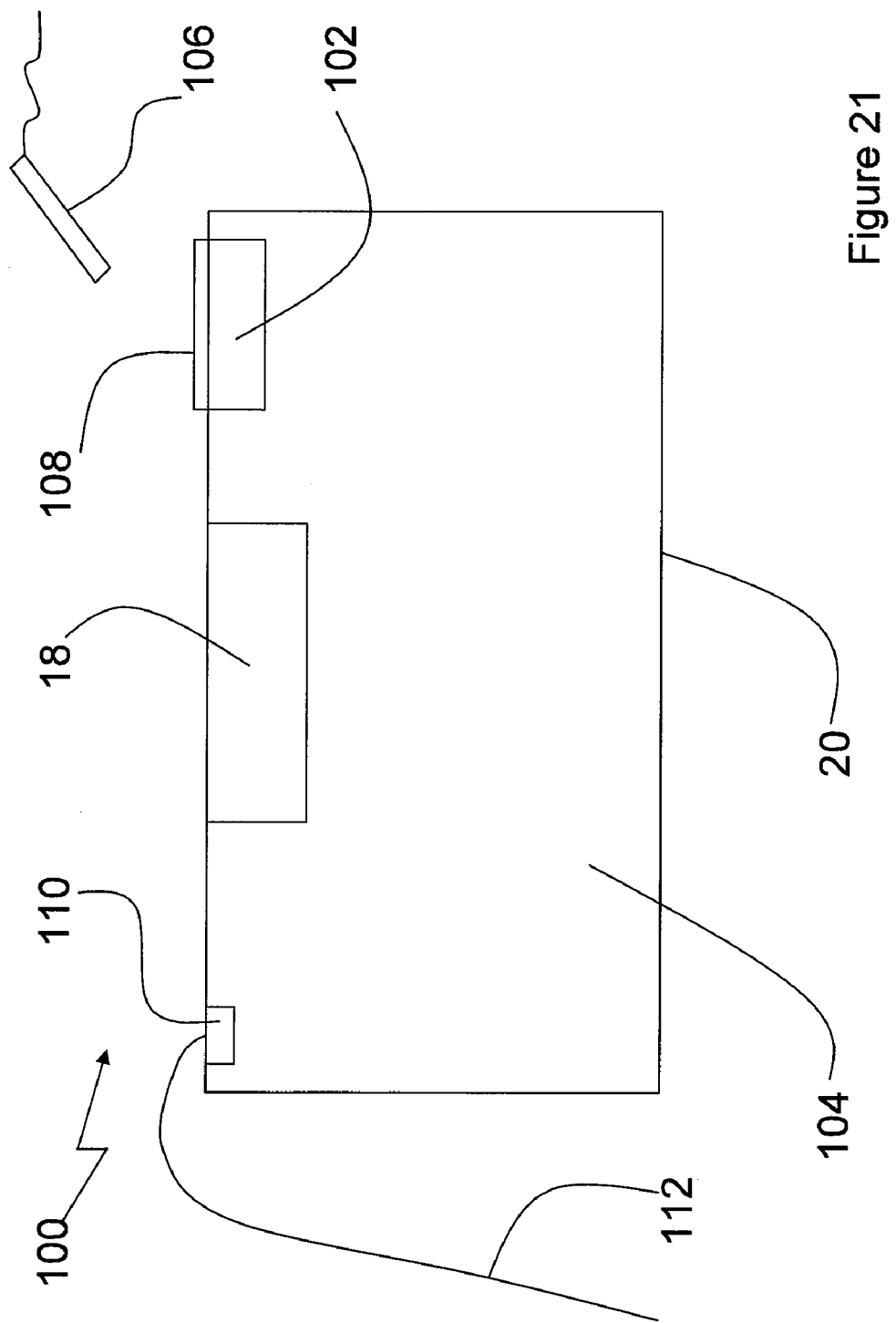
FIG. 21 illustrates an apparatus for interrogating an electronic component integrated into a DUT.
Figure 22:
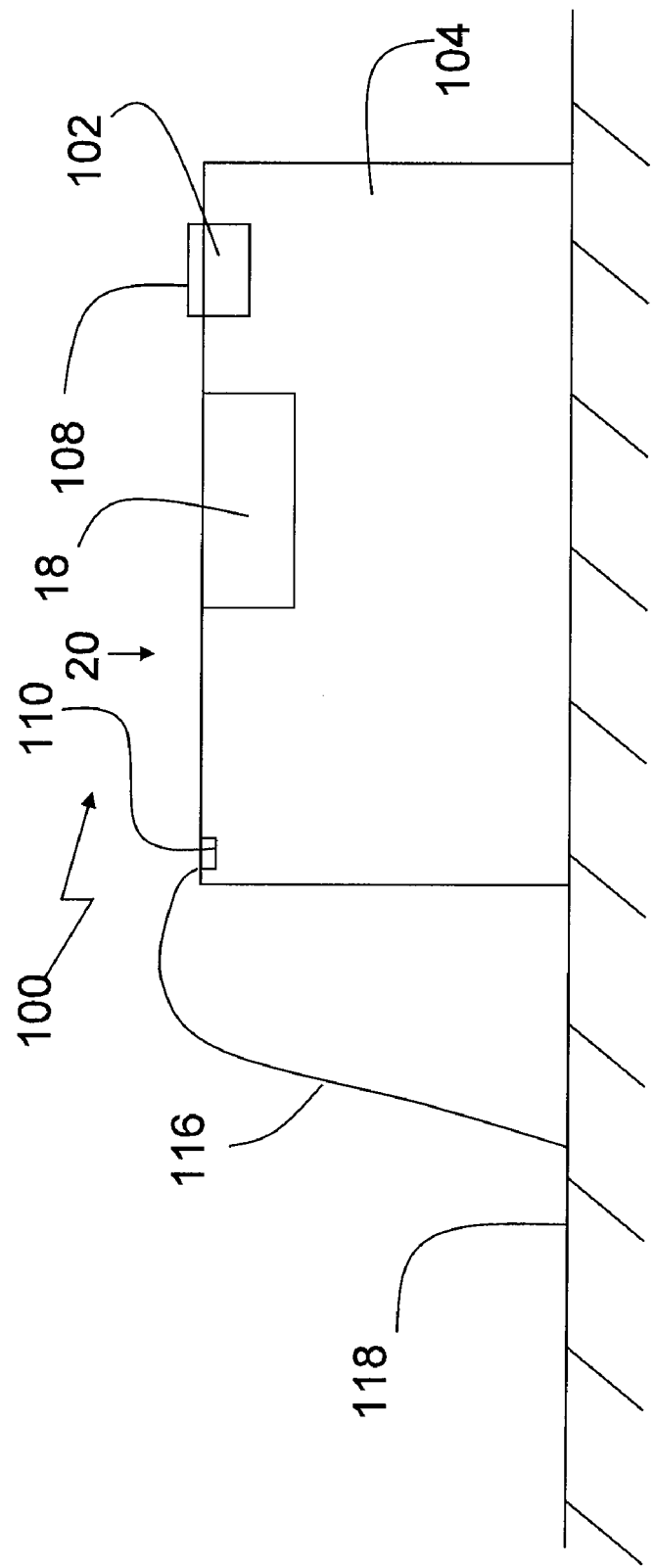
FIG. 22 illustrates an apparatus for interrogating an electronic component as a component of a DUT.

SAP 100 will now be described with reference to FIGS. 21 through 23. A SAP 100 may be incorporated into a DUT 20 where such SAP 100 comprising a body providing a contact test port 102 is provided on the substrate 104 of a DUT 20 to enable wireline testing using a probe 106 to contact interface in the form of a touchpad 108 as illustrated in FIG. 21. Test port 102 is conductive and is in direct electronic communication with the components on one or more DUT 20 that are to be tested. A WTAP 18 may also be provided in combination on DUT 20.

Optionally, test port 102 may also be in electronic communication with one or more connection points 110 to allow wired communication of power or data along wire 112 between the DUT 20 and other devices.

In a preferred embodiment, test port 102 will be a special multi-contact panel that is constructed from a robust material such as tungsten or titanium, or a pad of gold that is thicker than conventional gold contacts, so as to enable multiple contacts by probe 106 without causing significant damage to test port 102.

It will be recognized that a description of the robust material of the present invention may be made of other conductive material or composite conductive material that is resilient or non-marking and so such descriptions are non-limiting.

Optionally, SAP 100 may be incorporated into a multi chip device comprising at least one DUT 20 and at least one SAP 100. SAP 100 has bond wires 116 to conduct one or more of power and data to substrate 118, for example a circuit board as illustrated in FIG. 22.

Figure 23:
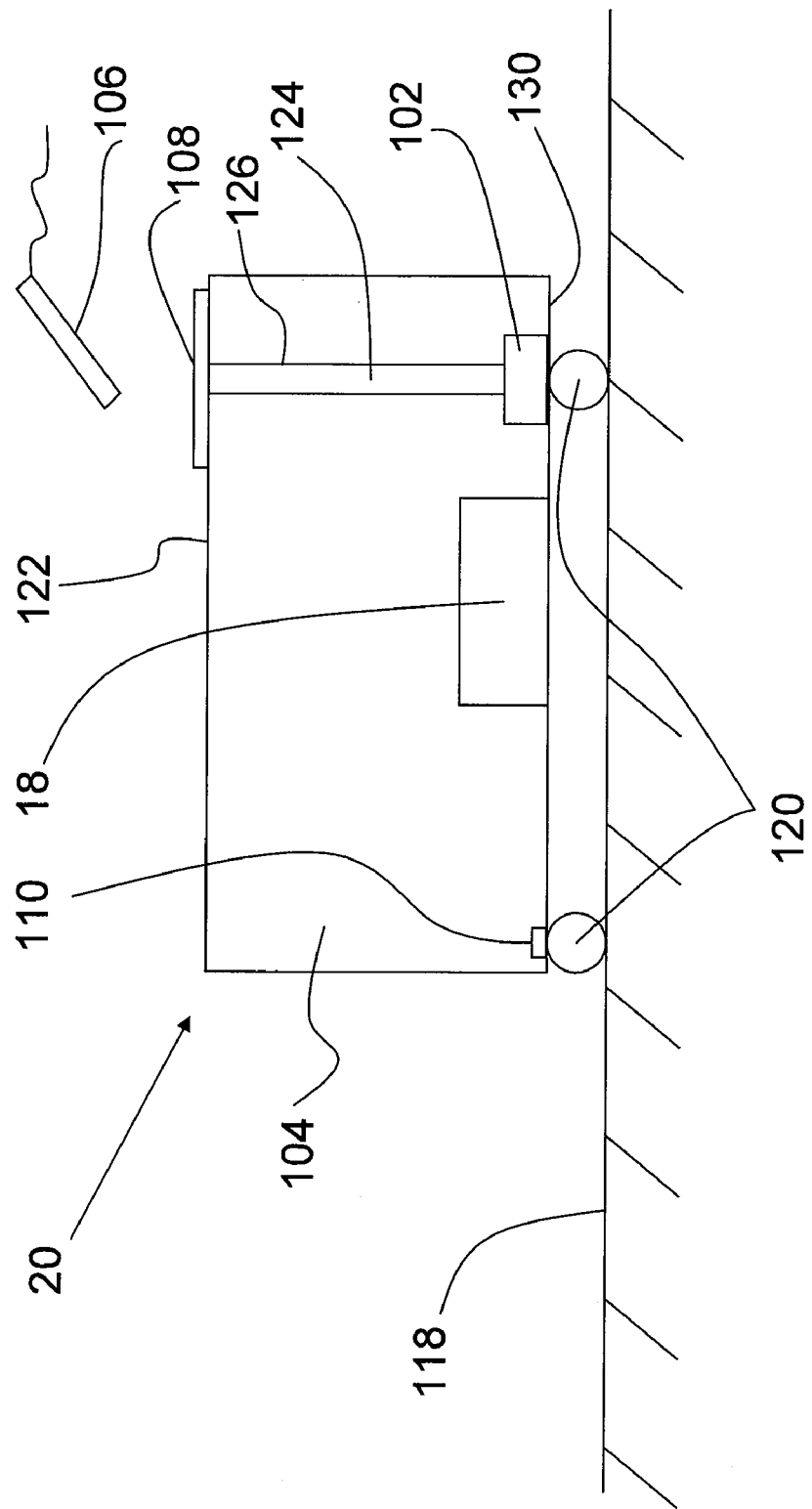
FIG. 23 illustrates an apparatus for interrogating an electronic component as a component of a DUT flip chip mounted.
Figure 24:
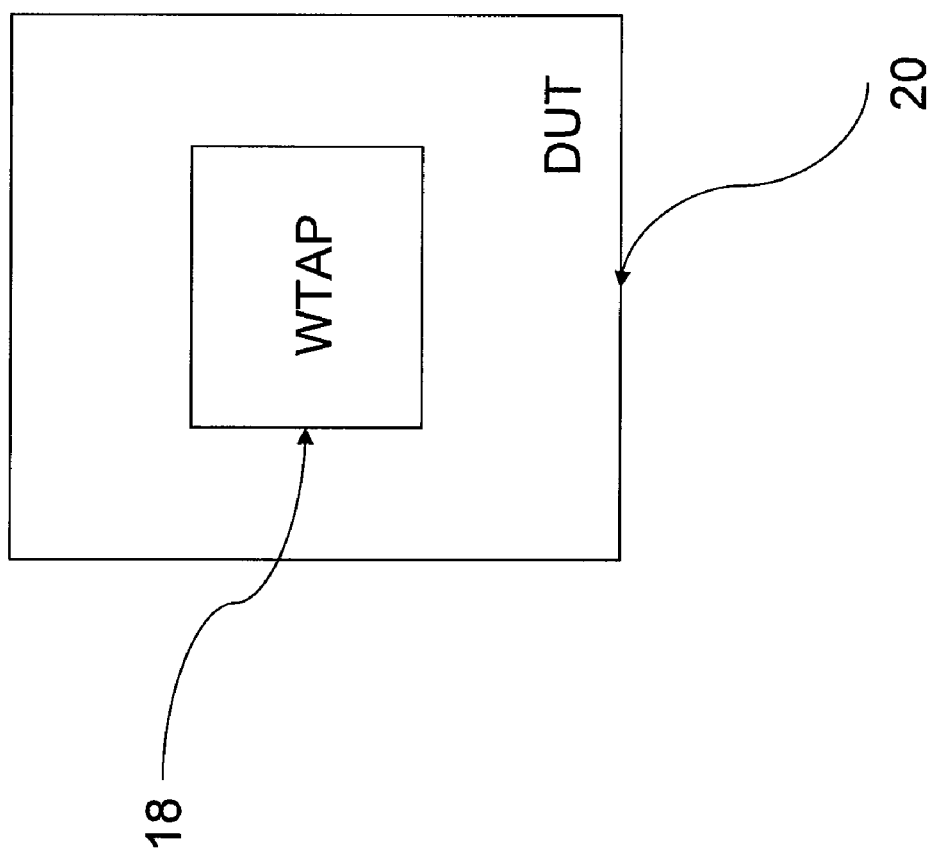
FIG. 24 illustrates a an apparatus for interrogating an electronic component with WTAP integrated into a DUT.
Figure 43:
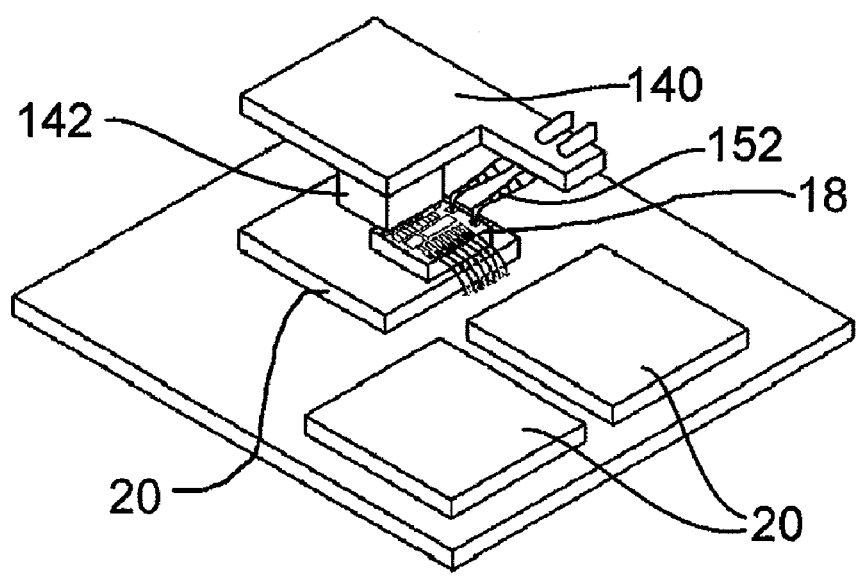
FIG. 43 illustrates an apparatus for interrogating an electronic component with the WTAP integrated onto the DUT.

Referring to FIG. 23, optionally, SAP 100 may be usable in "flipped" orientation, in which WTAP 18, test port 102 and connection points 110 are on a first face 130 placed opposed to and adjacent an extended substrate 118 such as a board. Test port 102 and connection points 110 are then in contact with electrical contact points 120 on substrate 118 and are thereby in communication with other electronic components on the same substrate 118. Referring to FIG. 24, optionally WTAP 18 may be incorporated into DUT 20, or onto DUT 20, as shown in FIG. 43. It will also be understood that some or all of the WTAP circuit elements may be included in the scribe lines for an undiced semiconductor wafer.

Referring again to FIG. 23, in a flipped orientation, touchpad 108 of test port 102 is situated on the opposite second face 122 of SAP 100 from that adjacent substrate 118. A "via" 124 is an electronic conductor situated in a hole 126 drilled through, for example, a chip when substrate 104 is silicon, so that touchpad 108 is in electronic communication with the other parts of test port 102 situated on first face 130 adjacent to substrate 118. An advantage of this arrangement is that touchpad 108 may be significantly larger, up to the whole area of second face 122, than one placed amid the components on first face 130 as the electronic components to be tested. Another advantage is that second face 122 can be utilized for multiple touchpads 108, for example for independent and simultaneous supply of electrical power and RF communications, and for one or more connection points 110.

Optionally, touchpad 108 of test port 102 is situated on the opposite second face 122 of SAP 100 from that adjacent substrate 118. A conductive trace 132 is situated around the first face 130, an edge face 134, and the second face 122 so that touchpad 108 is in electronic communication with the other parts of test port 102 situated on the first face 130 adjacent to the substrate 118 (not shown in drawings).

Figure 25:
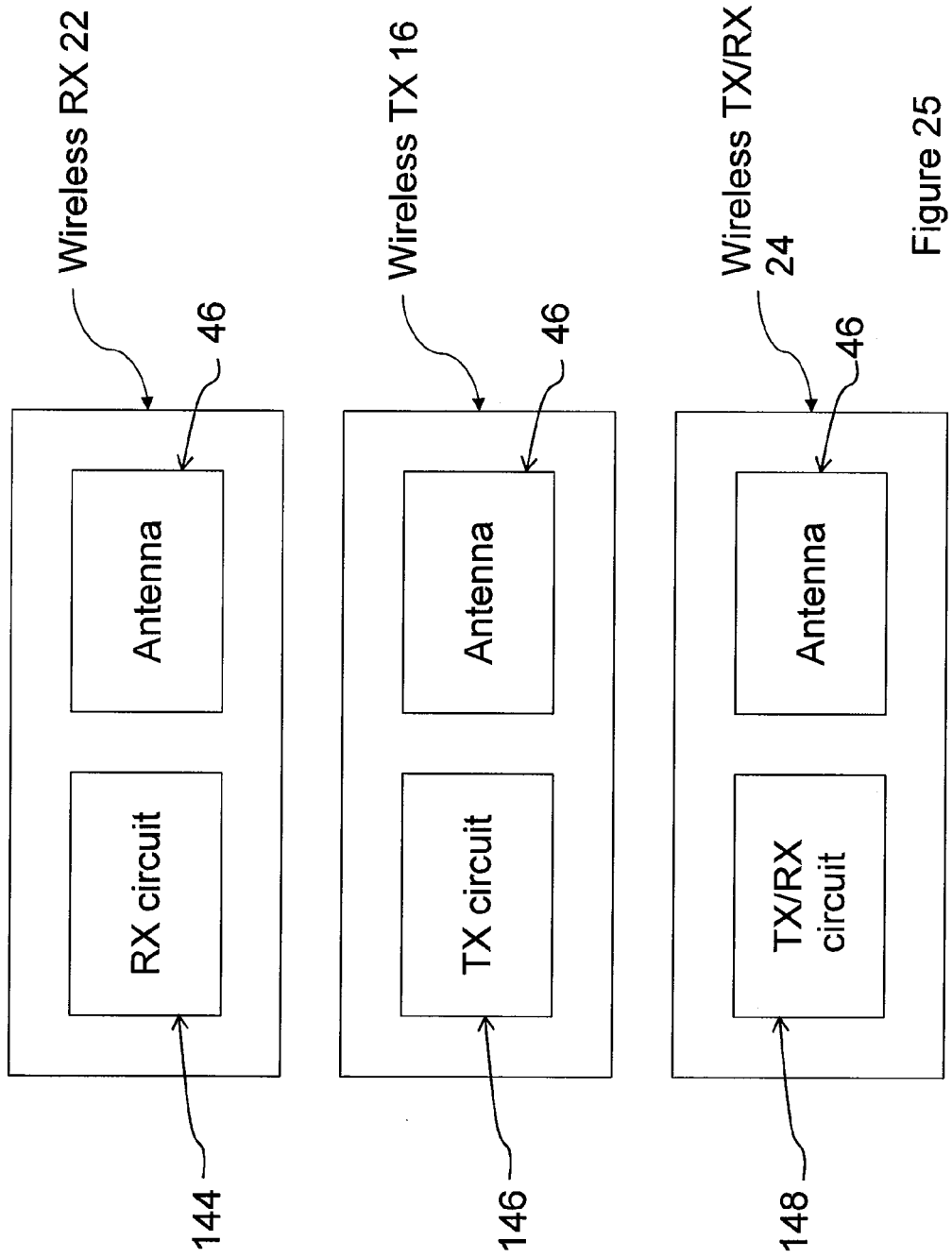
FIG. 25 illustrates an apparatus for interrogating an electronic component with chips having severally a transmitter and an antenna, a receiver and an antenna, and a transceiver and an antenna.
Figure 26:
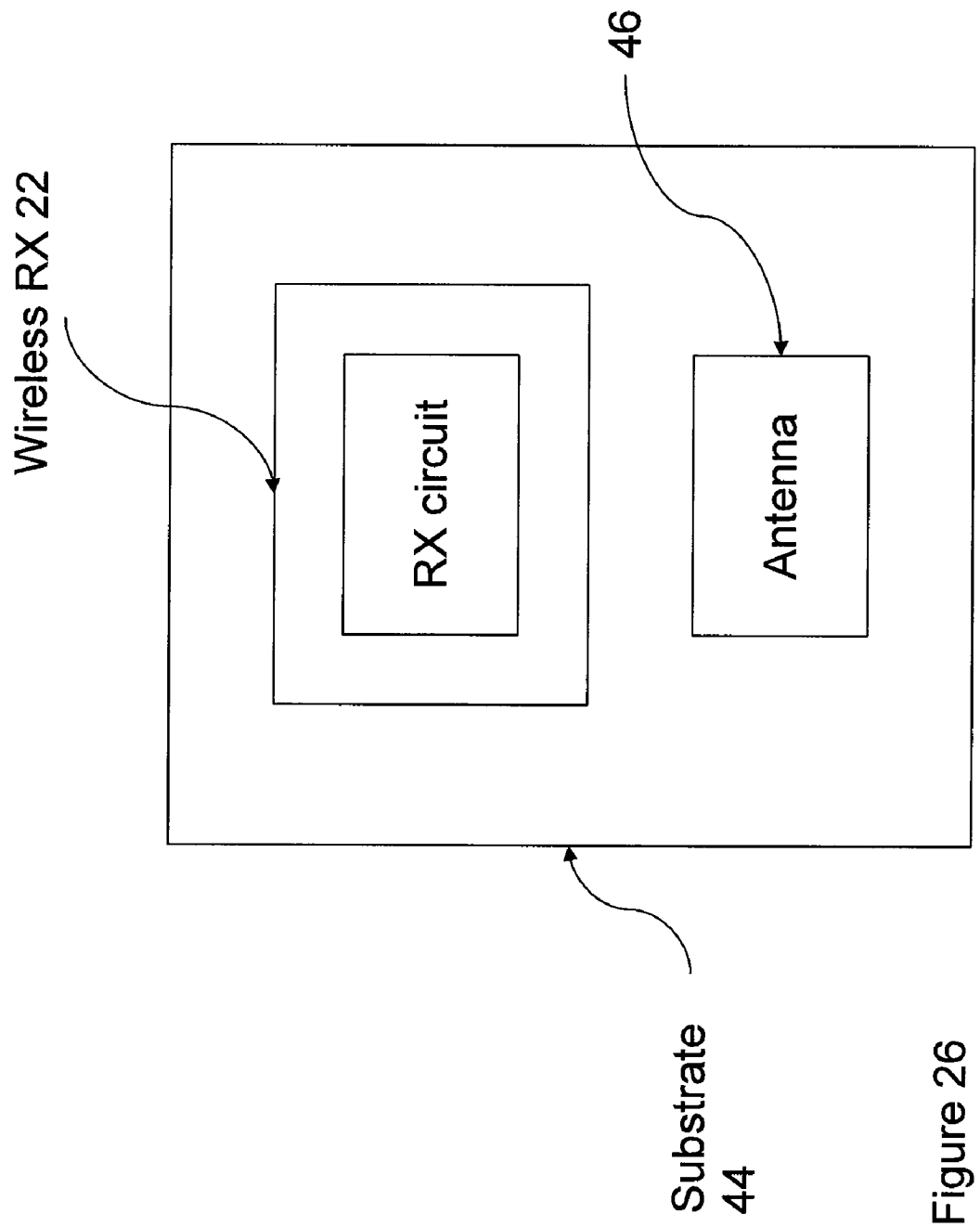
FIG. 26 illustrates an apparatus for interrogating an electronic component with an antenna and a wireless RX2 mounted to the same substrate.
Figure 27:
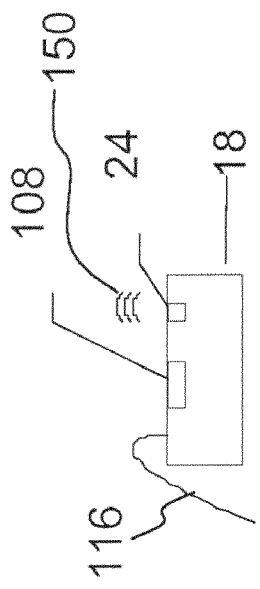
FIG. 27 illustrates an apparatus for interrogating an electronic component having an electronically contactable test port and a transmitter RX2.
Figure 28:
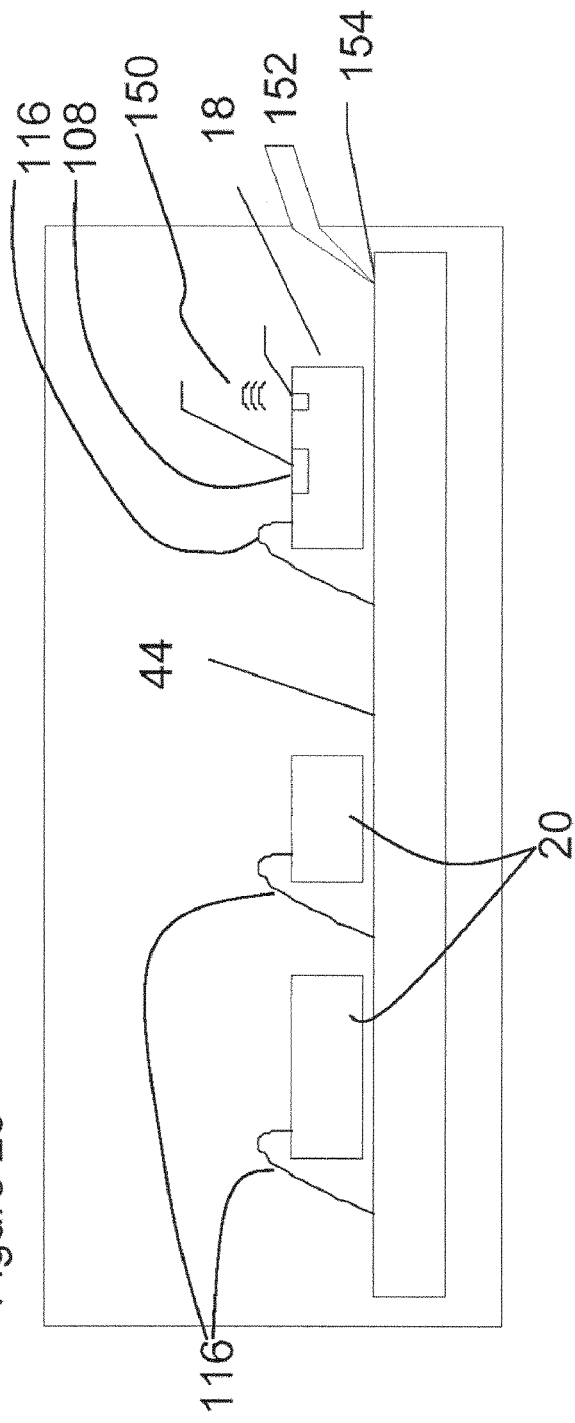
FIG. 28 shows schematically the apparatus for interrogating an electronic component shown in FIG. 27 hardwired into electrical contact with a substrate through which it is in communication with two devices under testing.

Referring to FIG. 25, transmitter 16 is a combination of Tx circuitry 144 and an antenna 46, receiver 22 is a combination of Rx circuitry 146 and antenna 46, and transceiver 24 is a combination of transceiver circuitry 148 and antenna 46. Referring to FIG. 26, antenna 46 and a receiver 22 may be mounted to the same substrate 44. Referring to FIG. 27, WTAP 18 optionally includes both of touch pad 108 as an electronically contactable test port and transmitter/receiver 24 for wireless communications 150. WTAP 18 is hardwired by wire 116 to other circuitry. Referring to FIG. 28, when WTAP 18 and at least one DUT 20 are hardwired into electrical contact with the same substrate 44 they are in electrical communication whereby DUT 20 can undergo testing. Power 152 is provided via a substrate contact 154.

Figure 29:
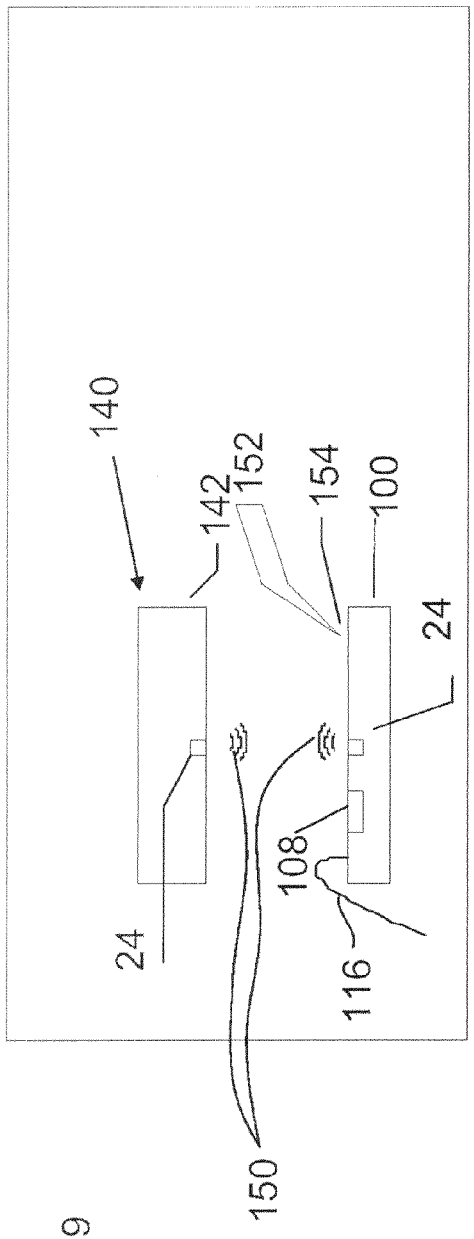
FIG. 29 illustrates an apparatus for interrogating an electronic component with a probe card and a SAP in bidirectional wireless communication.
Figure 30:
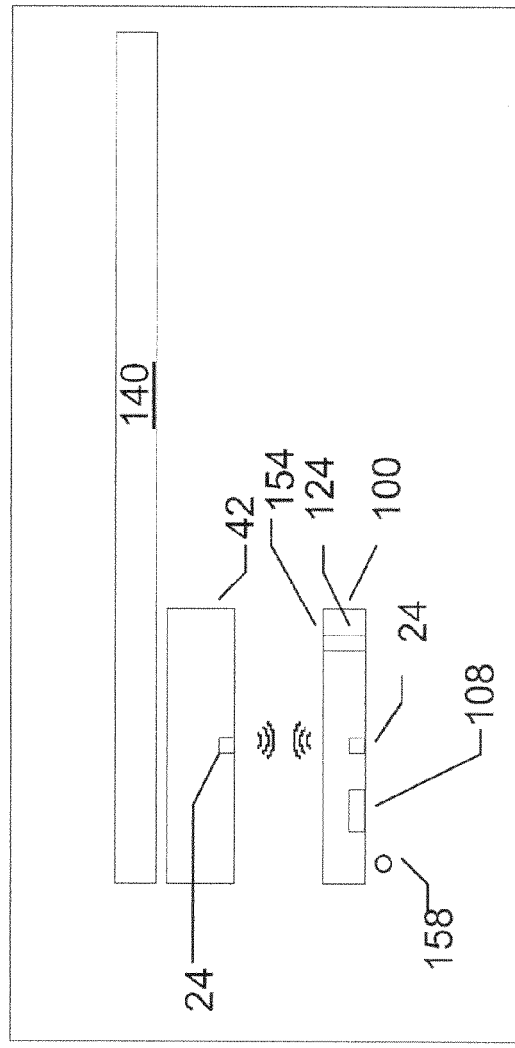
FIG. 30 illustrates an apparatus for interrogating an electronic component with a probe card having a probe in bidirectional communication with a chip that is a SAP, the chip being in flipped orientation.
Figure 31:
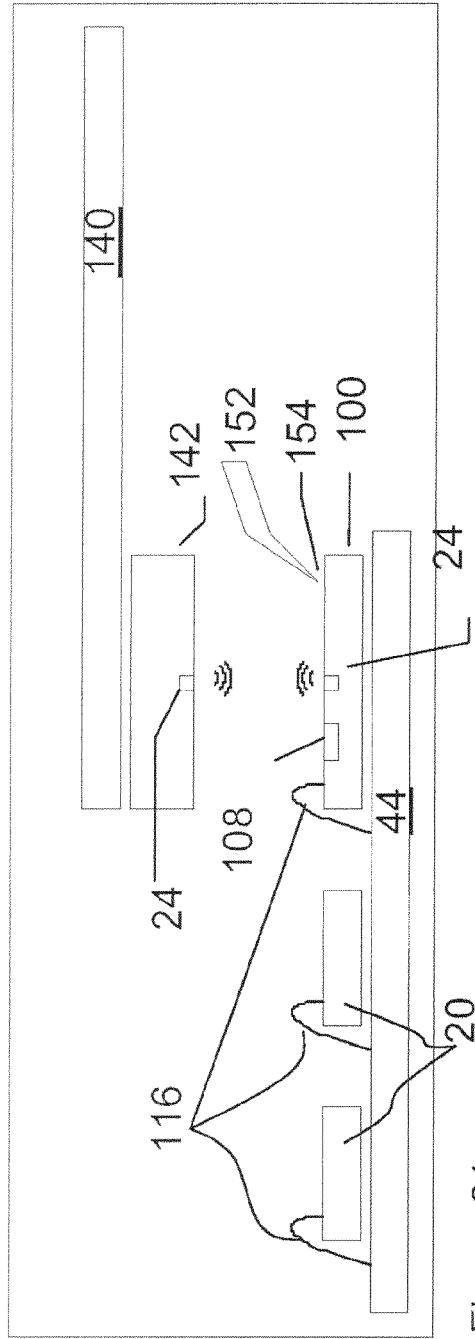
FIG. 31 illustrates the apparatus for interrogating an electronic component with the probe card, probe and SAP shown in FIG. 30, used to test two devices under test mounted to the same substrate as the SAP.

Referring to FIG. 29, transceivers 24 at each of a probe card 140 and SAP 100 enable bidirectional wireless communication. Referring to FIG. 30, probe card 140 having a probe 142 can be in bidirectional communication with SAP 100 when that chip is in flipped orientation, and SAP 100 is in electrical communication with substrate 44, for example by solder balls 158. A via 156 provides electrical contact between the faces of SAP 100. Referring to FIG. 31, when SAP 100 and at least one DUT 20 are mounted on the same substrate 44 and are in electrical communication, probe card 140 and probe 142 are used to test each DUT 20 so mounted.

Figure 32:
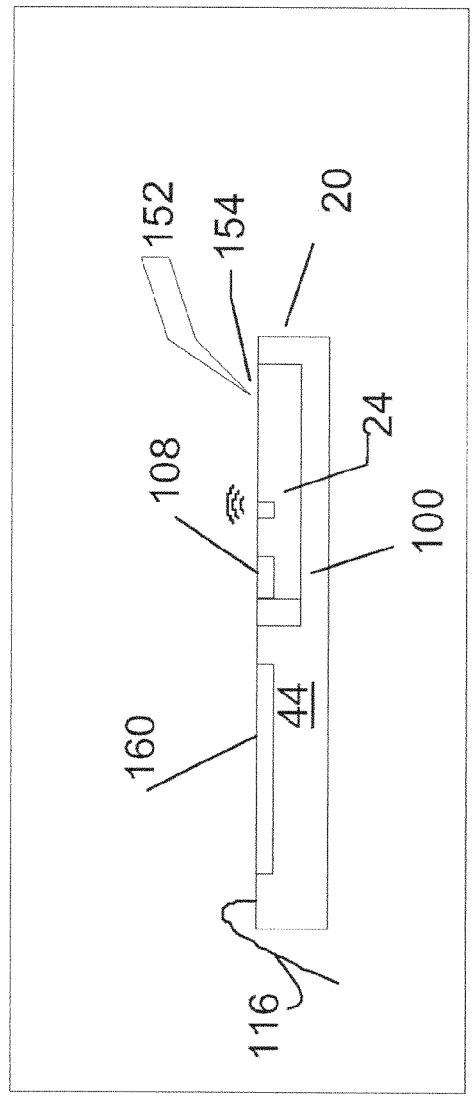
FIG. 32 illustrates an apparatus for interrogating an electronic component with a SAP integrated into the device under test.

Optionally, SAP 100 and DUT circuits 160 can be integrated into DUT 20, as illustrated in FIG. 32.

There are several advantages of the present invention. With SAP 100, circuits and electronic components of DUT 20 can be tested either by establishing wireless communication through WTAP 18, by establishing electrical communication through contact by probe 106 at touchpad 108, or both. When a higher level of power is required than can be supplied using WTAP 18, that level of power can be supplied through touchpad 108.

Additional advantages accrue when SAP 100 is in flipped orientation. The area of touchpad 108 can be enlarged so as to allow multiple contacts without causing irreparable harm to DUT 20.

Touchpad 108 can be manufactured from any durable material compatible with the other components of the circuitry, thus providing capability for multiple contacts by probe 106.

A method for one or both of communication between and testing of electronic devices and integrated circuits is described. Provision is made for testing using either or both of wireless methods and physical methods using electronic contact by a probe. The wireless method uses a wireless communication block (WCB), and a device access port (DAP) or a test access port (TAP). The WCB is used to wirelessly communicate with a probe, and the DAP or TAP is used to directly communicate with or test an electronic device. The contacting method involves the use of a contact pad on the electronic device that is in electronic communication with the integrated circuits thereon, and a probe in electronic communication with automated test equipment. Optionally, a logic controller can be used to convert input instructions and data into test signals.

In parallel with the above system, an on-device electronic contact is provided for communication or testing using a physical probe. Such test ports are the predominant and only commonly-used method of communicating or testing electronic components in the electronics industry. Communication or testing requires physical, electrical contact between a probe and the electronic component, also known as "DC coupling" or "wireline coupling", for example, testing of an integrated circuit via an on-chip structure that is conductive. Test needles are brought into contact with the circuit at these test ports in order to make a DC-coupled, wireline link.

EXAMPLES

The apparatus and method of the present invention have been experimentally tested as will be illustrated in the following examples.

Example 1

RF Simulations

The performance of the antenna structures and transceiver circuits is critical to the operation of the WTAP. These have been extensively modeled and simulated. For the antennae, the simulations were performed using a combination of four different simulation software 3D packages. The first two packages, Totem (developed in an academic environment) and AxFDTD use the Finite Difference Time Domain (FDTD) method. The third and fourth packages were, Advanced Design System (ADS) and Sonnet, which use Method-of-Moments (MoM) analysis. Using simulations on each of the different packages was used to determine the optimum antenna geometry, antenna pitch, antenna size, matching circuits, and antenna termination from a theoretical point of view. A discussion of basic antenna design modeling for wireless chip to chip communications can be found in, for example, Sellathamby et al. "Wireless Probe Card", Southwest Test Workshop, Session 7, 2004, and Floyd et al. "Wireless Interconnection in CMOS IC with Integrated Antennas", IEEE ISSCC 2000, Paper W A 19.6, February 2000, pp. 238.

Example 2

Scaled Antennas

While computer models for antennae are helpful they are necessarily incomplete because of the micro environmental details within the ICs. For example, CMP metal is used on sub-micron VLSI chips to allow manufacturability and yield with multi-layer metal chips. It is a key enabler of the production of chips but creates a major impact the electromagnetic microenvironment especially when attempting to have wireless communications off chip. Because fabrication and experimentation of this directly in VLSI is expensive and time consuming a design of experiments model of the antenna environment on chip was conceived to answer unknowns with respect to antenna micro-environments. Several antenna environments were produced at a 200× chip scale using of standard electronics materials. These results allowed a quick test of the microenvironment issues for the eventual silicon design.

Theoretically antennas scale over all sizes and wavelengths. That is, size is directly proportional to wavelength. Therefore antenna Length=1/Freq. Inductance and Capacitance scale directly with linear size.

The scaled antenna test setup is described as follows. A Network Analyzer (NA) HP 8702B was wired to an RF Coupler (Mini Circuits ZEDC-10-2B) to provide a reference signal back to the NA in order to maintain constant forward power. The forward path of the coupler (output) was connected to transmit antenna of the scaled test pair. On the other (receive) antenna a measuring oscilloscope was used to measure the coupling of the antenna pairs.

Figure 33:
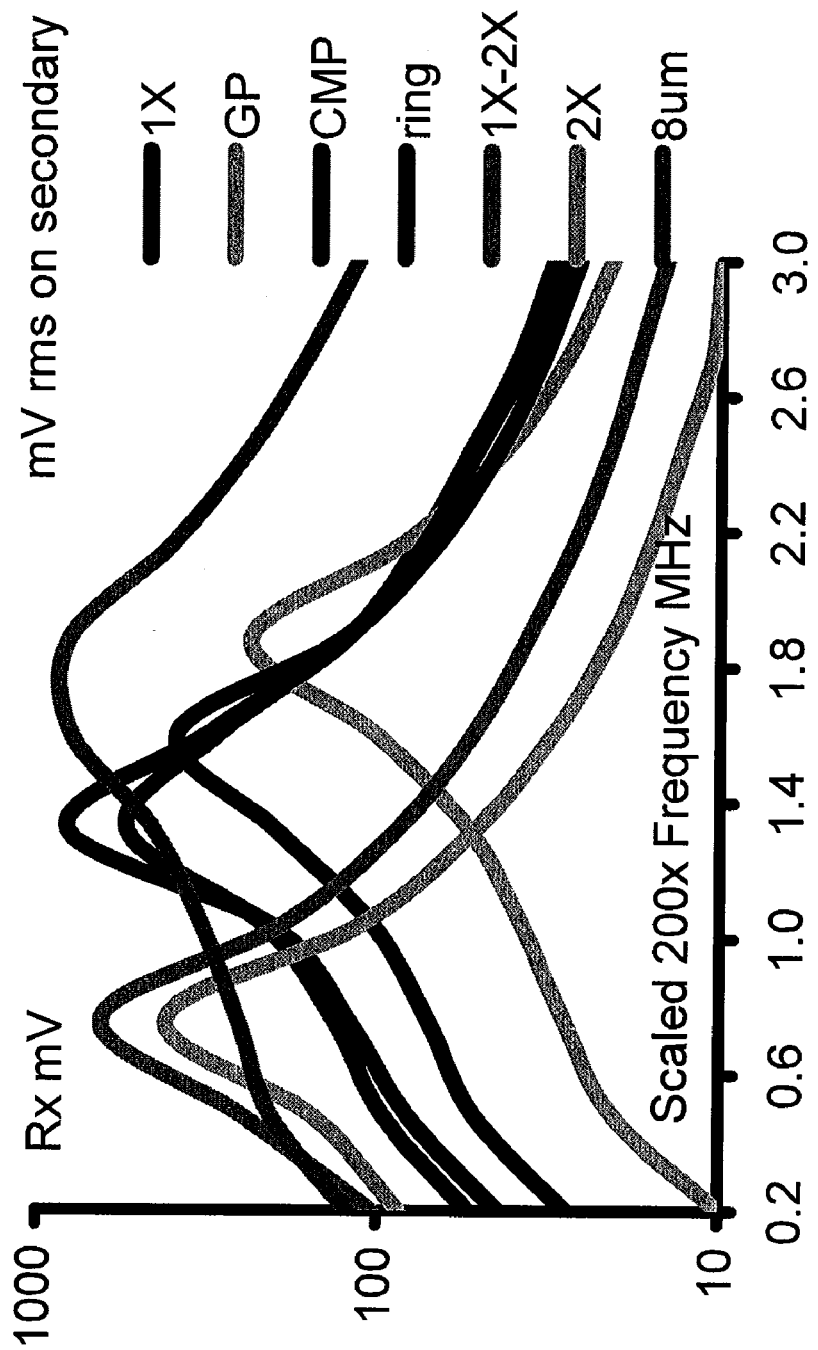
FIG. 33 illustrates a representative set of experimental results for an apparatus for interrogating an electronic component (coupling voltage versus frequency) with various scaled antenna environments.

FIG. 33 shows a representative set of experimental results (coupling voltage versus frequency) with various scaled antenna environments. In FIG. 33 one can see that the CMP appears improve coupling over that of a bare antenna (1×) while a ground plane (GP) has a definite negative impact. The design challenge is to pick an antenna structure that can give high coupling and wide bandwidth and yet not be too high in operating frequency, which is limited in CMOS.

The data showed that the design frequency of 1.5 GHz could be obtained with consideration of the microenvironment. CMP does not seem to have a major impact and that major conducting structures should not be placed (if possible) directly within the antenna area.

Example 3

Transceiver Design

The transceiver circuits used for data transfer were designed and simulated with CAD software tools. Because the system requirements for this implementation of JTAG required 10 M-baud throughput Amplitude Modulation (AM) was chosen as the most feasible and the lowest design risk communication method. Due to the system requirements, GHz carrier and low error rate, AM is a reasonable choice mostly due to it's simplicity of design and implementation. Earlier simulations included AM, FM and direct digital modulation techniques.

The receive chain was also chosen to be a relatively simple in this case a low power LNA without frequency tuning. This gives a low power and real estate budget and at the same time avoids the selection of tuned elements, which likely have deleterious frequency dependence a shown earlier with the design of experiments of antennae environments.

To enable very high fidelity (low error rate) data transmission the RF carrier frequency was chosen to be a large multiple of the data rate. In our case a 1.5 GHz carrier was chosen from a coupling, power consumption and communications fidelity point of view. Since the transmission range is small, but constrained by the use of a relatively low frequency CMOS technology careful design of the transmitter and receiver are required. An envelope detector was used for demodulation. This circuit was designed with a minimal number of components to save area. One area of particular attention is the susceptibility to noise in a test environment. The high carrier frequency versus the modest (relatively) data rate goes a long way to militating against noise.

A guard ring placed away from the antenna was included, and careful consideration of CMP design rules (metal fill) and an N-well barrier was placed around the transceiver in the physical layout. This was done to reduce the susceptibility to interference caused by noise and to reduce coupling to the rest of the circuit. The area occupied by the transceivers using the AM technique is on the order of the antennas themselves.

The transceivers were designed in a 130 nm 'standard' logic CMOS process of a major semiconductor foundry as follows:
Technology: CMOS 0.13 um
Number of metal layers: 8 available, 8 used
RF design frequency: 1.0-1.5 GHz
Antenna size: 120 um×120 um A CMOS (130 nm technology) chip was fabricated and is show in FIG. 34. This figure shows both the DUT (Left) and the Probe (Right) as well as antennas (TOP). In this picture the Probe IC is wire bonded (lower right) to a ceramic board, which is part of the wireless probe shown at the center of the probe card in FIG. 35.

The results from the performance evaluation of the fabricated CMOS circuits are presented as follows. The above simulation results are experimentally verified using the CMOS chips. After fabrication the DUT/Probe ICs were tested for functioning RF transmit signals on a standard probe station.

A custom RF (contactless) Probe was designed and placed proximally central to the DUT/Probe antennas to show operation of 5 independent transmit path signals, TDI, TCK, TMS, DIRIN, *TRST. An RF spectrum analyzer was used with the custom probe to observe the RF carriers.

Figure 36:
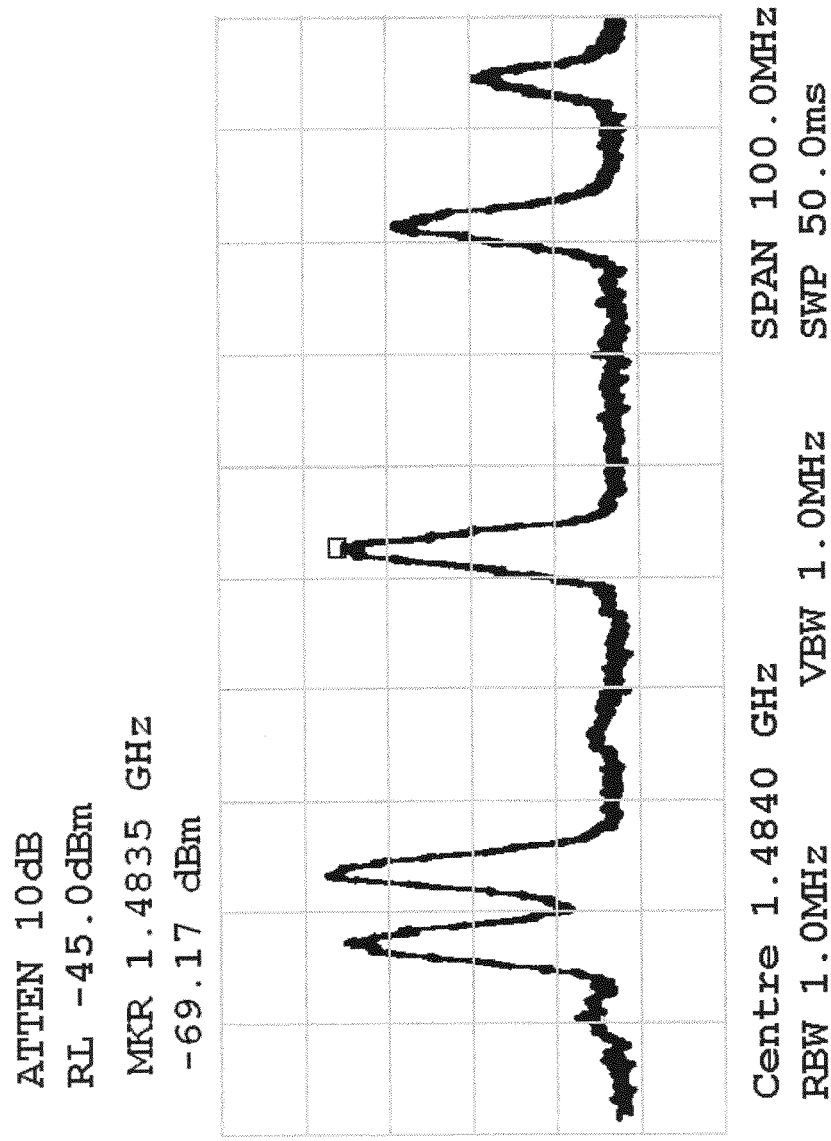
FIG. 36 illustrates the results of one test of an apparatus for interrogating an electronic component and demonstrates the independent (parallel) nature of the transmitting signals.

FIG. 36 demonstrates the independent (parallel) nature of the transmitting signals. The testing showed 100% yield for testing of fourteen devices, indicating that the fabrication of the basic RF transmit carrier was successful. Each RF signal is controlled by its own Voltage Controlled Oscillator (VCO) and further by its own data path. The carrier frequency measured was 1.48 GHz with a spread of less than 100 MHz. This is completely adequate with respect to a narrow frequency as required by the tuning effect of coupling antennas mentioned earlier. These parallel RF signals between the Probe and DUT (SiP) become virtual wires for the JTAG signals, thus providing a wireless TAP. As mentioned earlier these five transmit signals are used for the JTAG Probe signals. On the DUT there are five corresponding receivers.

Example 4

Probe Physical Design

Figure 34:
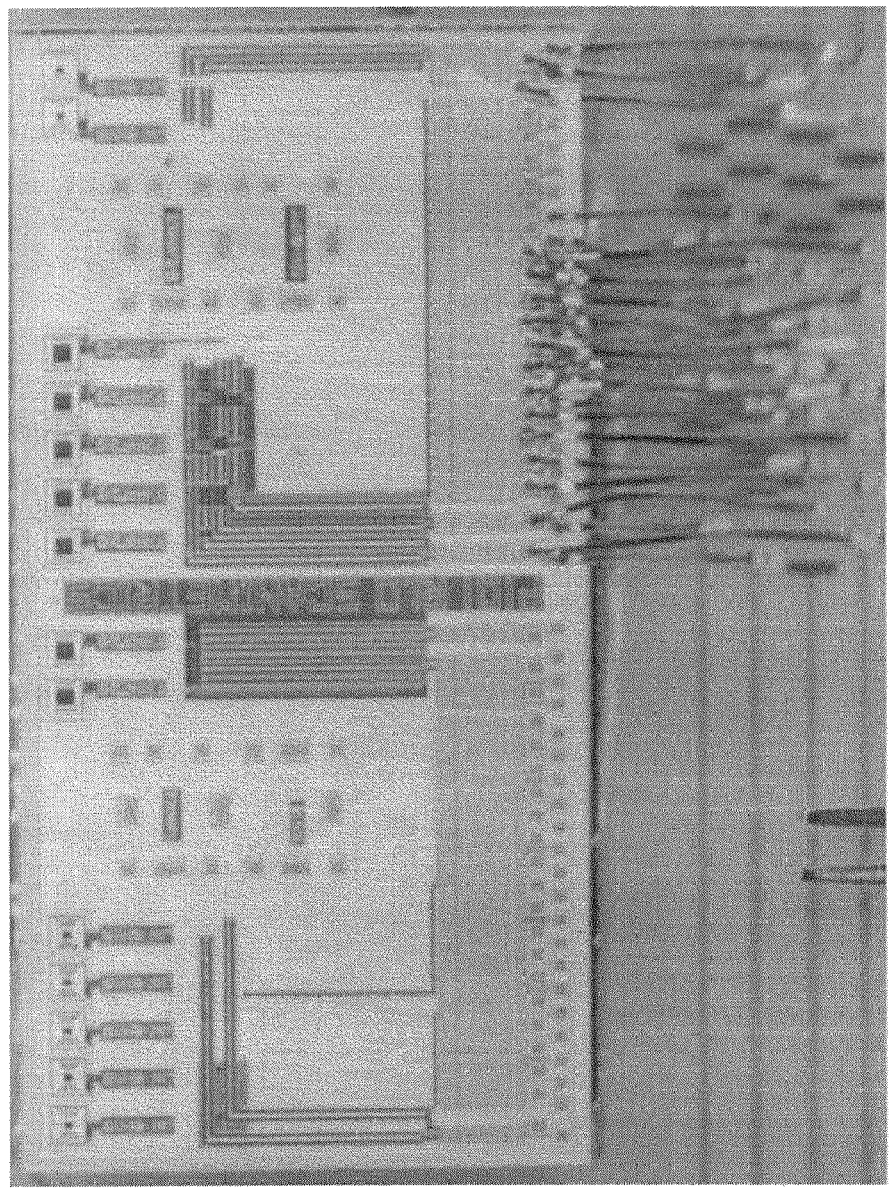
FIG. 34 illustrates both the DUT (Left) and the probe (Right) as well as antennas for an apparatus for interrogating an electronic component (TOP). Here the probe IC is wire bonded (lower right) to a ceramic board, which is part of the non-contact probe.
Figure 35:
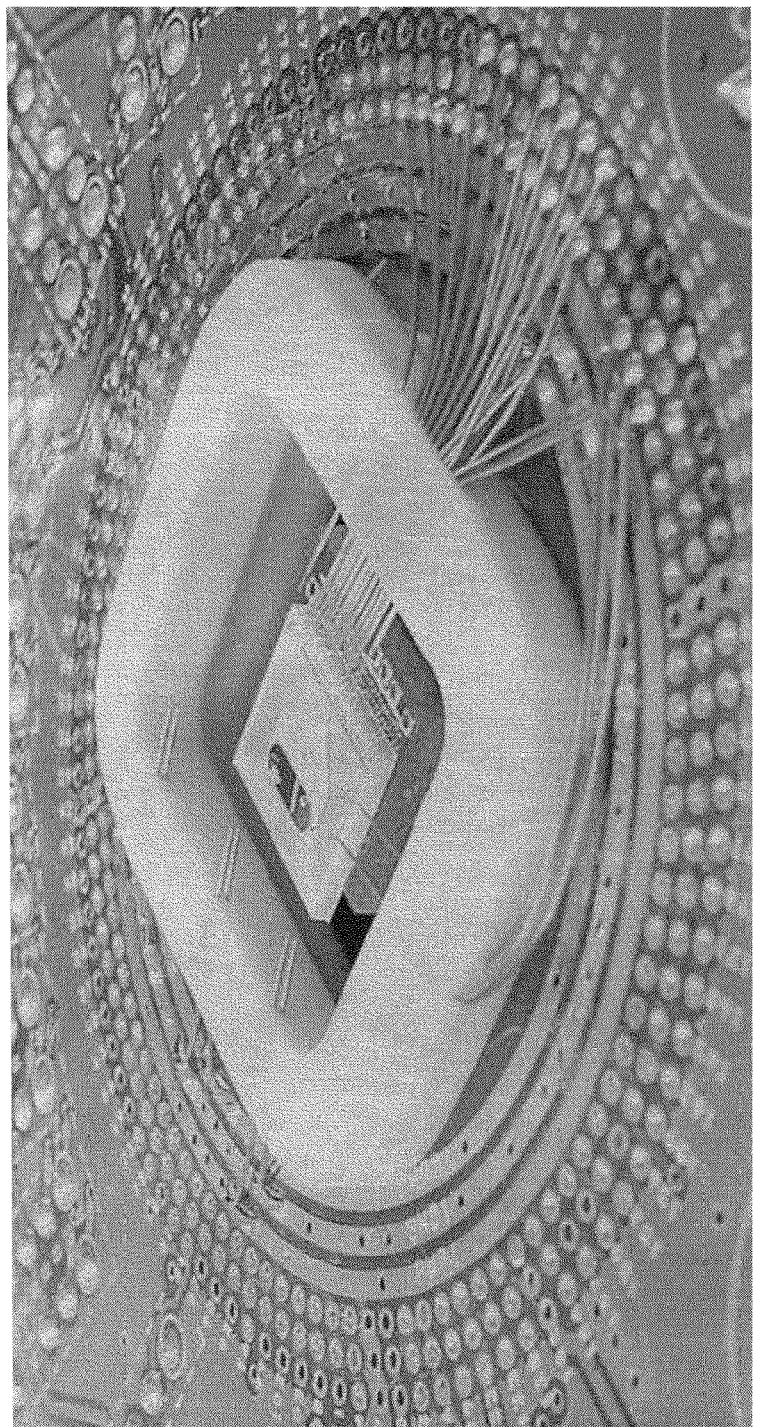
FIG. 35 illustrates a hybrid apparatus for interrogating an electronic component with non-contact probe card. The non-contact probe is placed in the center opening of a standard probe card. Standard probe needles, seen on the periphery of the non-contact probe card, provide power to the SiP non-contact DUT.

FIG. 35 shows a hybrid wireless probe card. The wireless probe, illustrated in FIG. 34, is placed in the center opening of a standard probe card. Standard probe needles seen on the periphery of the wireless probe card provide power to the SiP wireless DUT.

The wireless probe shown in the center of FIG. 35 consists of five elements:
1. Probe transceiver IC
2. Ceramic transition hybrid
3. PCB with ribbon connector to Probe PCB
4. Back mounting post
5. Wireless Probe mount (fits within topside Probe card PCB ring)

All of these must fit in the throat of the opening of an unmodified probe card. Bench testing was carried out on a standard prober. Face to face error rate testing was carried out on a custom xyz probe holder. SiP production testing was carried out on an Electroglas 4090u prober with an Agilent 4070 tester on the production floor of NXPs production facility in Caen France.

Electrical parametric tests can detect defects other than functional faults. For example, Iddq tests can detect some resistive faults that are not severe enough to cause a logical fault in digital circuits. Some tests can be used to detect elevated quiescent current above normal. A standard element in testing is a ring oscillator, which can be used to find basic gate delay as well as yield issues. A long chain ring oscillator was included in the WTAP DUT to allow process parameters to be observed both by the wireless interface (ring Osc. frequency) as well as ATE (Iddq) connected to the Prober.

With the hybrid design the DUT can be placed in various modes and the SiP can be tested for Iddq as it is assembled. Any out of spec part or manufacturing step can then be noted for rejection of additional component placement or final packaging.

Example 5

Wireless Error Rate Testing

To test the integrity of the system data error rate tests were performed to evaluate the raw error rate under ideal and non-ideal DUT probe placement conditions as well as seeing the range of mechanical offsets possible. A bit error rate test was used to determine error rate of wireless communications link. On the transmit (digital input) probe side a test pattern was with a Tektronix CSA 907T test set. The DUT receive signal (digital output) was connected to the companion Tektronix CSA907R receiver. The clock rate was set to 20 MHz on test the units to match the design goal of 10 Mbaud data rate. The pseudorandom bit pattern was selected on the transmitter. The receive test set was set to observe the same pattern. The receive level settled on 0.4 volts. This low voltage is due to 50 ohm termination of the Tektronix test set loading the CMOS DUT output. The low power CMOS logic output of the DUT normally would not see 50 ohms and thus loaded the output to a lower voltage level. When the probe was situated over a DUT mounted on a SiP substrate a 30 um gap was set between DUT and probe.

Figure 37:
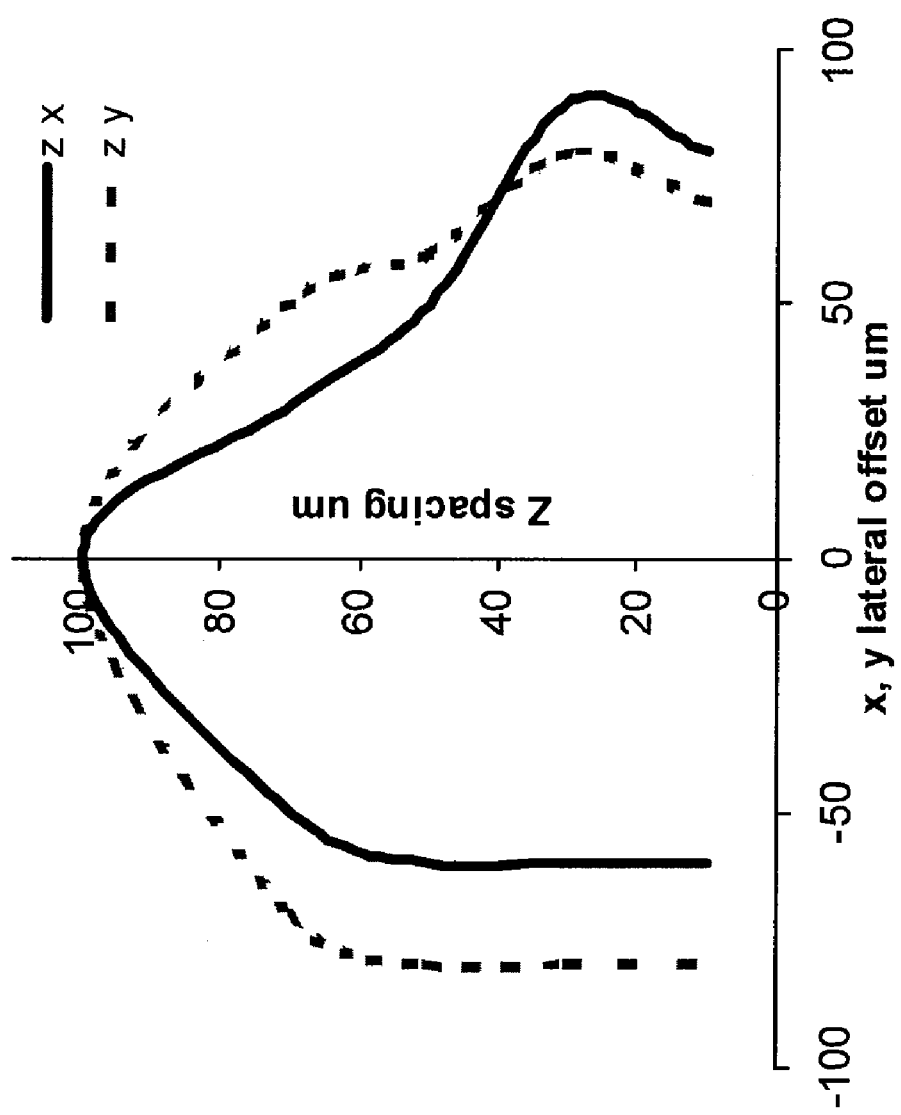
FIG. 37 illustrates error rate versus vertical and lateral DUT to probe alignment offsets of an apparatus for interrogating an electronic component.
Figure 38:
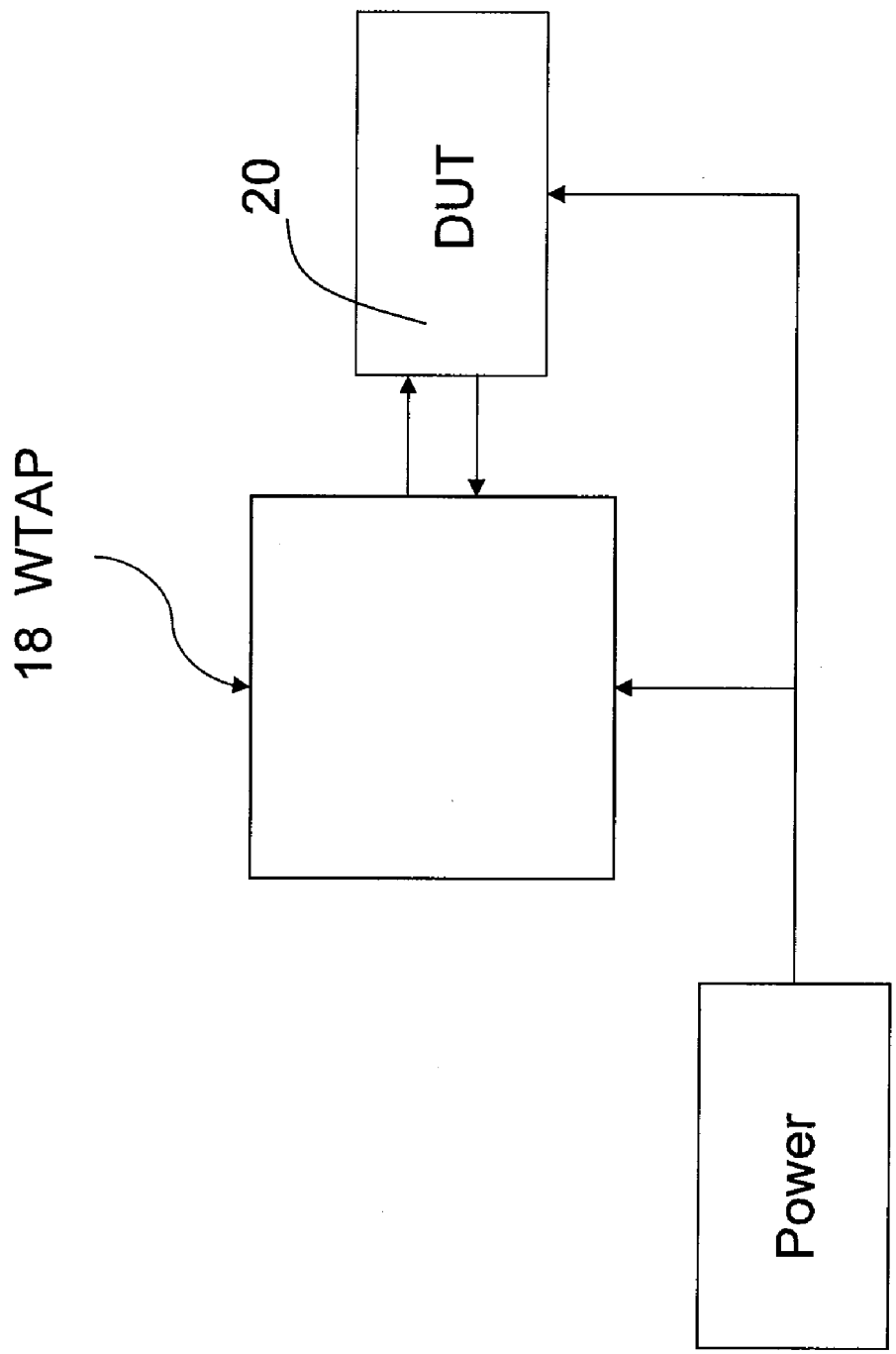
FIG. 38 is a block diagram of an apparatus for interrogating an electronic component illustrating power applied externally to the WTAP and DUT.
Figure 39:
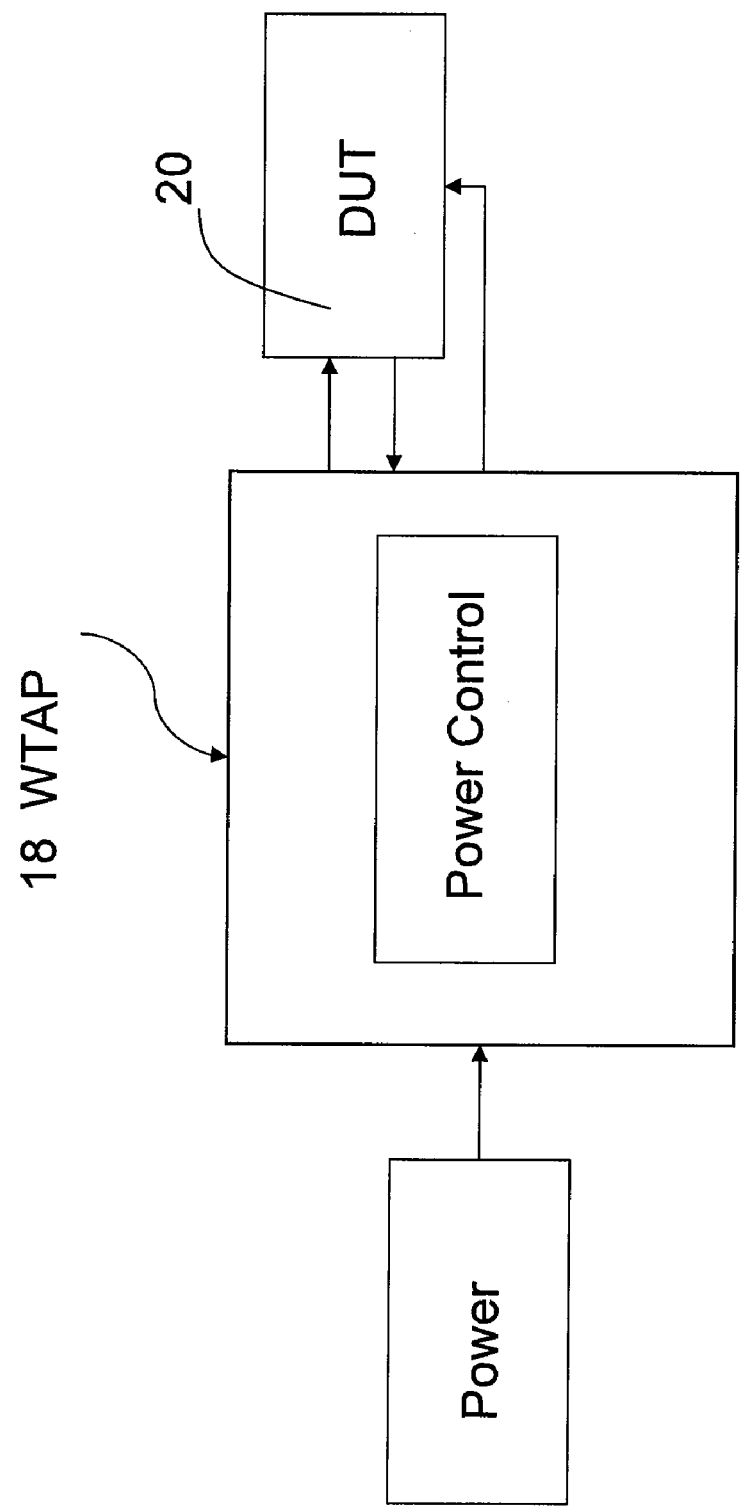
FIG. 39 is a block diagram of an apparatus for interrogating an electronic component illustrating power applied externally to the WTAP and the WTAP supplying and controlling power to the DUT.
Figure 40:
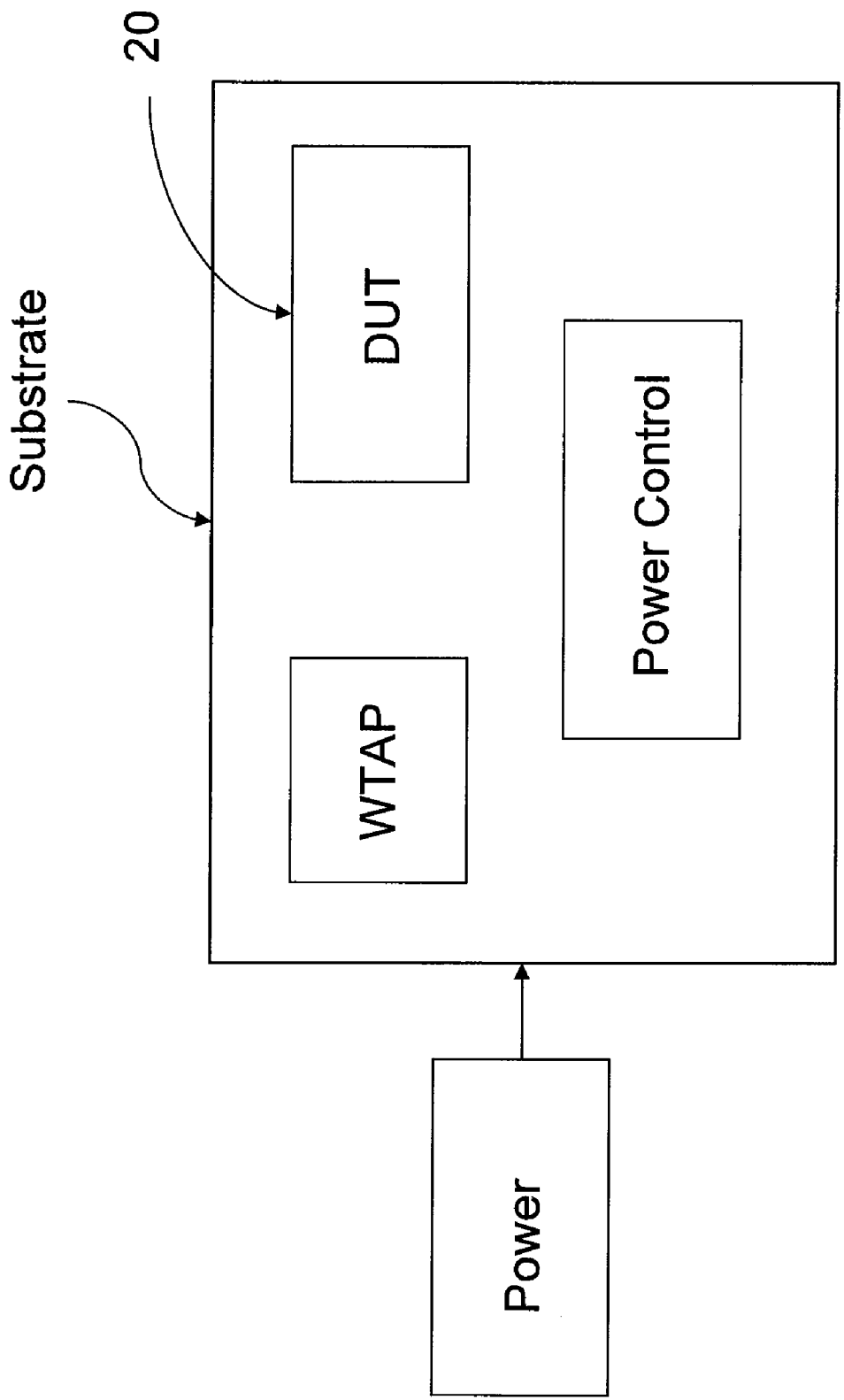
FIG. 40 is a block diagram of an apparatus for interrogating an electronic component illustrating power applied externally to the substrate.
Figure 41:
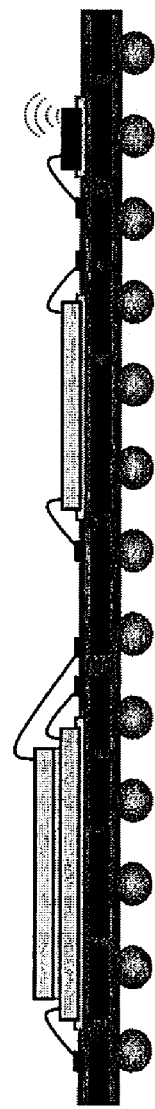
FIG. 41 illustrates an apparatus for interrogating an electronic component with an SAP device mounted on a substrate.
Figure 42:
FIG. 42 illustrates an apparatus for interrogating an electronic component with a SAP device integrated within an integrated circuit.

FIG. 37 shows error rate versus vertical and lateral DUT to probe distance offsets and the 10-10 error rate contours. Within the contour the error rate is essentially zero and outside the error rate rapidly increases to 100%. The +Z direction has greater separation between DUT and probe. The +ZX direction moves the probe to increase the overlap with the DUT. The −ZX direction moves the probe in the opposite direction, giving less overlap with the DUT. The ZY direction moves the probe laterally so that antennas are more or less overlapped. It can be seen in FIG. 37 that the required floating probe location for good data integrity is approximately +/−50 um in the X or Y direction, and between 0 and 45 um in the Z direction.

| | | |
|---|---|---|
| 18 (1) - WTAP | 48 (5.1) - Wireless Tx in probe side | 28 (8.1) - Logic Controller |
| 10 (2) - WCB | 16 (5.2) - Wireless Tx on WTAP side | 30 (8.2) - LFSR |
| 12 (3) - TAP | 50 (6.1) - Wireless Rx on probe side | 32 (8.3) - General purpose memory |
| 20 (4) - DUT | 22 (6.2) - Wireless Rx on WTAP side | 34 (8.4) - Input Vector Memory |
| | 52 (7.1) - Wireless Tx + Rx on probe side | 36 (8.5) - Output Vector Memory |
| 24 (7.2) - Wireless Tx + Rx on WTAP side | 42 (8.6) - D/A |
| | 40 (8.7) - A/D |
| | 38 (8.8) - Comparator |
| | 46 (8.9) - Antenna |

What is claimed is:

1. A method for interrogating an electronic component, comprising:
   providing an electronic component comprising multiple discrete circuits on a substrate;
   providing a body functioning as a test access port or system access port, the body having an interface with an antenna for communication with a non-contact wireless interrogating device, the body having a logic circuit for converting instructions from the non-contact wireless interrogating device into control signals, communication signals or both to be applied to the electronic component, the body being separate and distinct from the interrogating device and the discrete circuits of the electronic component;
   securing the body to the substrate of the electronic component and hardwiring the body to at least one discrete circuit of the electronic component, the body being carried by the electronic component;
   performing multiple discrete interrogations of the discrete circuits via the interface of the body without the interrogating device physically touching the electronic component;
   packaging the electronic component in an integrated circuit package after at least one discrete interrogation has been performed.

2. The apparatus of claim 1, wherein the body enables the multiple discrete circuits to be interrogated at least one of in parallel or in series, or individually.

3. An apparatus for interrogating an electronic component, comprising:
   an electronic component comprising multiple discrete circuits on a substrate suitable for being packaged in an integrated circuit package
   a body functioning as a test access port or system access port secured to and carried by the substrate, the body being hardwired to at least one discrete circuit of the electronic component, the body being separate and distinct from an interrogating device and the discrete circuits of the electronic component, the body having an interface with an antenna for wireless communication with the interrogating device, the body having a logic circuit for converting instructions from the non-contact wireless interrogating device into control signals, communication signals or both to be applied to the discrete circuits.

4. The apparatus of claim 3, wherein the body is a bare die mounted to the substrate.

5. The apparatus of claim 3, wherein the body is incorporated within an integrated circuit that performs other functions.

6. The apparatus of claim 3, wherein the body is integrally formed within the substrate.

7. The apparatus of claim 3, wherein the body is a discrete component positioned upon an integrated circuit.

8. The apparatus of claim 3, wherein the interface includes at least one of a transmitter, a receiver, or a transceiver.

9. The apparatus of claim 8, wherein the interface includes at least one transceiver having a separate transmitter circuit and a separate receiver circuit.

10. The apparatus of claim 3, wherein wireless communication includes one of capacitive coupling, inductive coupling, or electromagnetic waves.

11. The apparatus of claim 3, wherein the logic circuit includes a pattern generator.

12. The apparatus of claim 3, wherein the body has an output verification circuit for verifying the outputs of the electronic component.

13. The apparatus of claim 3, wherein the body has at least one of an analog to digital converter or a digital to analog converter.

14. The apparatus of claim 3, wherein the interface comprises a wireless communication block having a transmitter and a receiver.

15. The apparatus of claim 3, wherein at least one of the body and the electronic component includes a wired input adapted to receive at least one of data and power.

16. The apparatus of claim 15, wherein the wired input is contact pad.

17. The apparatus of claim 15, wherein the wired input is a multi-contact panel.

18. The apparatus of claim 3, wherein the body is wirebonded to the electronic component.

19. The apparatus of claim 3, wherein the body is in a flipchip arrangement with the electronic component.

20. The apparatus of claim 3, wherein the interface comprises multiple antennas connected for communicating with an interrogating device in parallel across multiple channels.

21. The apparatus of claim 3, wherein the electronic component comprises an integrated circuit package that includes the body, the substrate and the discrete circuits.

22. The apparatus of claim 3, wherein at least one of the body and the electronic component comprises a wireless power input for wirelessly receiving power.

* * * * *